(12) United States Patent
Kojima

(10) Patent No.: US 6,441,384 B1
(45) Date of Patent: Aug. 27, 2002

(54) CHARGED PARTICLE BEAM EXPOSURE DEVICE EXHIBITING REDUCED IMAGE BLUR

(75) Inventor: Shinichi Kojima, Kamagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/289,139

(22) Filed: Apr. 8, 1999

(30) Foreign Application Priority Data

| Apr. 8, 1998 | (JP) | 10-111357 |
| Jun. 25, 1998 | (JP) | 10-193581 |
| Sep. 21, 1998 | (JP) | 10-265886 |

(51) Int. Cl.$^7$ .................. H01L 21/027; H01J 37/30

(52) U.S. Cl. .................. 250/492.23; 250/492.22

(58) Field of Search .................. 250/492.23, 492.22, 250/492.2, 396 R, 398

(56) References Cited

U.S. PATENT DOCUMENTS

| 3,795,813 A | * | 3/1974 | Kunath | 250/396 R |
| 4,246,487 A | * | 1/1981 | Anger et al. | 250/396 R |
| 4,350,926 A | * | 9/1982 | Shelton | 313/455 |
| 5,821,542 A | * | 10/1998 | Golladay | 250/492.2 |

FOREIGN PATENT DOCUMENTS

| JP | 08-064522 | 3/1996 |

OTHER PUBLICATIONS

Hosokawa, "Systematic Elimination of Third Order Aberrations in Electron Beam Scanning System," *Optik* 56:21–30 (1980).

\* cited by examiner

*Primary Examiner*—Jack Berman
(74) *Attorney, Agent, or Firm*—Klarquist Sparkman LLP

(57) ABSTRACT

Charged-particle-beam microlithography apparatus and methods are disclosed that reduce spherical aberrations and other aberrations of the beam without increasing blurring from Coulomb effects or space-charge effects. The beam semi-angle of the beam as incident on the reticle and/or substrate is limited to a range greater than zero but less than an upper limit, so as to remove paraxial portions of the beam. Also, the substrate can be moved as required along the optical axis to place the substrate at the optimal image plane where beam spreading from spherical aberration is minimal. The beam semi-angle is preferably limited by passage of the beam through an annular aperture placed axially upstream of the substrate. A preferred range for beam semi-angle at the reticle is 1.5 to 3 mrad. Alternatively, at least six deflectors are disposed on the reticle side of a scattering aperture located in the projection-optical system, and at least three deflectors are disposed on the substrate side of the scattering aperture to simultaneously correct, respectively, deflection-induced image-plane inclination, deflection coma, deflection astigmatism, deflection chromatic aberration, deflection-induced secondary distortion (x and y directions), axial propagation of the beam through the scattering aperture, incidence of the beam at a target position on the substrate, and zero angle of incidence of the beam on the substrate.

21 Claims, 15 Drawing Sheets

CHARGED PARTICLE BEAM EXPOSURE DEVICE EXHIBITING REDUCED IMAGE BLUR

FIELD OF THE INVENTION

This invention pertains to microlithography apparatus for transferring a pattern (e.g., a circuit pattern), defined by a reticle, onto a sensitive substrate (e.g., semiconductor wafer) using a charged particle beam (e.g., electron beam or ion beam), as used in the manufacture of, e.g., semiconductor integrated circuits and displays.

BACKGROUND OF THE INVENTION

Increases in the level of integration of semiconductor devices have so far kept pace with demand for increasingly more intricate integrated circuits. To meet this demand, it has been necessary that microlithographic exposure apparatus used in the manufacture of such devices be capable of resolving circuit features having increasingly smaller critical dimensions so as to produce such increasingly intricate circuits. In view of the resolution limits of optical microlithography, microlithographic apparatus employing a charged particle beam (e.g., an electron beam) are the subject of much interest as the candidate pattern-transfer technology for achieving resolution of pattern features that are substantially smaller than resolvable by optical microlithography.

In charged-particle-beam (CPB) microlithography, the pattern is usually defined by a reticle. The reticle is illuminated by the charged particle beam; charged particles in the beam passing through the illuminated portion of the reticle carry downstream of the reticle an image of the illuminated portion. The image-carrying beam is focused onto a corresponding region of the substrate which is coated with a suitable "resist" that imprints the pattern. Thus, the reticle pattern is "transferred" to the substrate.

Due to various reasons, the entire reticle pattern is typically not illuminated at any one instant by the charged particle beam. Hence, the reticle field is typically divided ("segmented") into multiple exposure units such as "stripes," "subfields," or other regions (each defining a respective portion of the pattern) that are individually and sequentially exposed by the charged particle beam onto corresponding regions of the substrate. Projection of individual images on the surface of the substrate is accurately controlled to ensure that the images are contiguous with each other to form an image of the complete pattern without overlaps or intervening spaces between projected portions of the pattern. The resulting image of a complete reticle pattern on the substrate surface is termed a "die" which is typically coextensive with one of multiple "chips" typically exposed on the surface of a wafer. For details of this process, reference is made to Japanese Kôkai Patent Publication No. HEI 8-64522.

A schematic diagram of a conventional CPB microlithography apparatus is schematically illustrated in FIG. 1, depicting a charged particle beam (e.g., an electron beam), a crossover aperture 2a, a scattering aperture 2b, projection lenses 3a–3b, a substrate 5, an optical axis 6, a reticle 7, a CPB source 8, and condenser lenses 9a–9c. The reticle 7 is irradiated by the charged particle beam 1 emitted from the CPB source 8 via the condenser lenses 9a–9c. The charged particle beam 1 illuminates a selected region of the reticle 7; the beam passing through the illuminated region of the reticle 7 passes through the projection lenses 3a–3b and the scattering aperture 2b to form an image of the illuminated portion of the reticle on the upstream-facing surface of the substrate 5.

The combination of the condenser lenses 9a–9c (and the beam-shaping aperture 2a if present) is termed herein an "illumination-optical system." Similarly, the combination of the projection lenses 3a–3b (and the scattering aperture 2b if present) is termed herein a "projection-optical system." Each of the lenses 9a–9c, and each of the lenses 3a–3b, can be either an electromagnetic lens or an electrostatic lens as known in the art.

In conventional CPB microlithographic exposure, the charged particle beam is focused by the CPB projection-optical system comprising the projection lenses 3a–3b. Depending upon the specific type of projection-optical system used to make the exposure, if the projection lenses 3a, 3b are radially symmetrical about the optical axis 6 (as they typically are), then significant spherical aberrations are usually generated. Spherical aberrations tend to cause blurring of the image as projected onto the substrate.

Whenever edges of features of the pattern as projected are blurred, the resulting pattern has poorly transferred features with, for example, dimensions that are outside specification. Such exposure problems can result in unacceptable deviations in electrical performance of the circuit during use of the semiconductor device, such as breaks, shorts, high-resistance loci, poor gate performance, and the like, which ultimately result in failure of the semiconductor device to meet specification. Consequently, it is necessary to reduce spherical aberration as much as possible.

Spherical aberration is proportional to the cube of the "beam semi-angle" $\alpha$. The beam semi-angle can be measured at the substrate or at any of various other locations, especially where the beam is convergent or divergent, such as at stop locations. The beam semi-angle is the angular divergence of the charged particle beam from the optical axis at the measurement location. Denoting $C_{sph}$ as a spherical-aberration coefficient, $C_{sph}\alpha^3$ expresses the magnitude of the corresponding spherical aberration. Consequently, reducing the beam semi-angle at the image plane provides a way in which to decrease spherical aberration.

According to one proposed approach, multi-pole projection lenses are used. However, whereas aberration-correction methods that utilize multi-pole lenses are theoretically appealing, such methods exhibit considerable problems because manufacturing multi-pole lenses is extremely difficult. Furthermore, aligning the optical axes of multi-pole lenses is very difficult.

Aberration correction using multi-pole lenses has not yet become practical also because actual lens-field distributions exhibit considerable deviation from design specifications as a result of manufacturing errors and alignment errors in such lenses. Such deviations typically result in additional aberrations that degrade image fidelity and resolution. Okayama, *Electron Microscope* 25(3):159–166, 1990. Another practical problem is that operation of multi-pole lens systems requires extremely complex electrical control systems.

Besides lens aberrations, blurring of the charged particle beam can result from a "Coulomb effect" which is a Coulombic repulsion occurring between charged particles propagating near each other in the beam, especially at points of convergence and divergence. As the beam semi-angle is reduced, the particles in the beam tend to propagate closer together, thereby increasing the Coulomb effect. By increasing the beam semi-angle, the diameter of the electron beam is increased at points of convergence and divergence (e.g., stop locations), which results in an increased spacing between charged particles at such locations. This increased spacing weakens Coulombic repulsion in inverse proportion to the square of the distance between the particles, thereby resulting in less image blurring. Such a situation is illustrated in FIG. 2, in which the abscissa is the beam semi-angle and the ordinate is the magnitude of blurring.

Unfortunately, geometric aberrations (including spherical aberration) exhibited by lenses and deflectors used to focus and deflect the charged particle beam tend to increase as the beam semi-angle increases. Such increases in geometric aberrations tend to increase beam blurring, as also shown in FIG. 2.

With a multi-pole lens system, the interaction time between adjacent charged particles propagating in a beam increases because the distance from the object plane to the image plane is correspondingly increased. Such increased interaction time also increases beam blurring due to the Coulomb effect.

In view of the above, a practical way in which to effectively reduce blurring due both to the Coulomb effect and to spherical aberrations has not yet been realized.

Referring further to FIG. 1, according to conventional wisdom, it is preferable that the electron beam 1 have as high a beam current as possible so as to increase "throughput" (processing capacity per unit time). However, there are practical limits to the magnitude of the beam current. Namely, whenever the beam current is high, random scattering tends to occur between adjacent or nearby charged particles in the beam due to Coulombic repulsion. As a result, the beam becomes blurred by the time it reaches the substrate 5.

Another variable that must be considered with respect to image quality is the "space-charge effect." A charged particle beam generates its own electrical field. The space-charge effect acts on each individual charged particle in the beam propagating through that self-generated electrical field. The space-charge effect affects lens operation by changing the convergence of the beam in a manner similar to a normal electrostatic lens employing an electrostatic field to shape the beam. Such changes to beam convergence induces aberrations that are similar to lens aberrations, such as field curvature and distortion. The space-charge effect can also cause, independently of blurring due to random scattering, decreased resolution of the image produced by the charged particle beam.

In addition, the magnitude of the beam current passing through the reticle varies from region to region (e.g., subfield to subfield) depending upon normal differences in the feature density from region to region (e.g., subfield to subfield). Such changes in beam current manifest themselves as lens effects. Hence, even when the beam current illuminating the reticle 7 is maintained constant, the focal point of the beam will differ from region to region (e.g., subfield to subfield) as a function of region-mediated changes in beam current downstream of the reticle. This situation is shown in FIGS. 3(a)–3(b), in which item 5 is the substrate and item 3b is the second projection lens. In FIG. 3(a), the focal point is coincident with the substrate surface by action of the projection lens 3b on a relatively low-current beam.

When the beam current is relatively higher, as shown in FIG. 3(b), the focal point is not coincident with the substrate surface. In such an instance, correction is required. Since the individually exposed regions (e.g., subfields) on a reticle 7 typically have a variety of respective feature densities, the corresponding beam current will typically be different from region to region (e.g., subfield to subfield), thereby requiring correction for each individual region (e.g., subfield).

The higher the beam current used to illuminate the reticle 7, the wider the range of focus correction required. Whatever the correction system selected, it must be capable of operating at high speed over such a range of focal-point variation. Furthermore, the wider the range of correction required, the more problematic the aberrations generated by any focus-correction system that is employed, and the more severe the burden placed on an electrical control system for such a focus- correction system to ensure satisfactory operation at high speed over the range.

The beam semi-angle of a charged particle beam used for microlithography cannot be made too large due to limitations imposed by geometric aberrations in the lenses and/or deflectors. Therefore, there is a practical limit to the beam current. As a result, it has been difficult to obtain both high throughput and high resolution using high-current charged particle beams in conventional CPB microlithography apparatus.

SUMMARY OF THE INVENTION

The shortcomings of the prior art as summarized above are corrected by apparatus and methods according to the present invention.

According to a first aspect of the invention, charged-particle-beam (CPB) microlithography apparatus are provided that exhibit much less spherical aberrations and other aberrations. A first embodiment generally comprises an optical axis, an illumination-optical system, a projection-optical system, and an "aperture plate." The illumination-optical system is configured and situated so as to direct a charged particle beam from a CPB source to a reticle and illuminate a region of the reticle with the beam. The projection-optical system is configured and situated relative to the reticle so as to direct the charged particle beam, after the beam passes through the illuminated region of the reticle, to a substrate so as to imprint an image of the illuminated region on a corresponding exposure region on the substrate. The aperture plate is situated upstream of the substrate, and defines an aperture therethrough that transmits a portion of the charged particle beam. The transmitted portion, when incident on the substrate, has a beam semi-angle that is greater than a lower limit that is not zero, and less than an upper limit greater than the lower limit. The aperture plate can be situated, for example, within the illumination-optical system or the projection-optical system. Within such regions the aperture plate can be situated within a region in which the charged particle beam is collimated.

The aperture defined by the aperture plate is preferably annular in general profile or at least functions as if the aperture were annular in general profile. The aperture is preferably centered on the optical axis. (As an alternative to an aperture plate as summarized above, an annular cathode can be used.)

The apparatus generally exhibits a spherical aberration that, as a result of paraxial portions of the beam being blocked by the aperture plate, is lower in magnitude than spherical aberration exhibited by an otherwise similar charged-particle-beam microlithography apparatus lacking the aperture plate.

The apparatus can include a mechanism for moving the substrate along the optical axis to place the substrate at an axial position at which blurring of the charged particle beam incident on the substrate is maximally reduced. Alternatively, the apparatus can include a corrective lens that refracts the charged particle beam before the beam is incident on the substrate. Such refraction is preferably sufficient to maximally reduce blurring of the charged particle beam as incident on the substrate.

The charged particle beam can consist of any of various charged particles such as electrons and/or ions. If the beam is an electron beam, the projection-optical system preferably satisfies the conditions:

$$AL^a(I_{illum}/4)^b/[V^c(\alpha_{wafer-max})^d] \leq 40-2.5(\alpha_{wafer-max}-10)$$

$$I_{illum} \geq 70 \mu A$$

$$V \leq 200 \text{ KeV}$$

$$L \geq 300 \text{ mm}$$

wherein $I_{illum}$ is the beam current (in $\mu A$) of the electron beam as incident on the reticle, L is the axial distance (in mm) between the reticle and the substrate, V is the beam-acceleration voltage (in KeV) of the beam incident on the reticle, $\alpha_{wafer-max}$ is the maximum value of the beam semi-angle of the beam as incident on the substrate, and A, a, b, c, and d are constants, wherein $61 \leq A \leq 81$, $1.2 \leq a \leq 1.4$, $0.6 \leq b \leq 0.85$, $1.3 \leq c \leq 1.6$, and $0.6 \leq d \leq 0.8$. Preferably, $\alpha_{wafer-max} = m\alpha_{mask-max}$, wherein 1/m is the demagnification ratio of the projection-optical system.

According to another embodiment, a CPB microlithography apparatus is provided that comprises, on an optical axis, an illumination-optical system, a projection-optical system, and an aperture plate. The illumination-optical system is configured and situated so as to direct a charged particle beam from a CPB source to the reticle and illuminate a region of the reticle with the charged particle beam. The projection-optical system is configured and situated relative to the reticle so as to direct the charged particle beam, after having passed through the illuminated region of the reticle, to the substrate so as to imprint an image of the illuminated region on a corresponding exposure region on the substrate. The aperture plate is situated upstream of the substrate and comprises a central portion situated so as to block paraxial portions of the beam smaller than a first diameter and a peripheral portion situated so as to block off-axis portions of the beam greater than a second diameter that is larger than the first diameter. The aperture plate provides the beam as incident on the substrate with a range of beam semi-angles not including a zero beam semi-angle. If the beam is an electron beam, then the projection-optical system preferably satisfies the conditions:

$$AL^{a}(I_{illum}/4)^b[V^c(\alpha_{wafer-max})^d] < 40-2.5(\alpha_{wafer-max}-10)$$

$$I_{illum} \geq 70 \mu A$$

$$V \leq 200 \text{ KeV}$$

$$L \geq 300 \text{ mm}$$

wherein $I_{illum}$, L, V, $\alpha_{wafer-max}$, A, a, b, c, and d are defined above.

According to another aspect of the invention, methods are provided for performing microlithographic projection-transfer of a pattern, defined by a reticle, onto a sensitive surface of a substrate. A charged particle beam is directed from a CPB source to the reticle to illuminate a region of the reticle with the charged particle beam. The beam passing through the illuminated region of the reticle is directed to the sensitive surface of the substrate so as to imprint an image of the illuminated region on a corresponding exposure region on the sensitive surface. Beam blurring at the sensitive surface as caused by any one or more of geometrical aberrations (which include spherical aberrations), Coulomb effects, and space-charge effects is reduced. Such reduction is achieved by, e.g., blocking paraxial portions of the beam smaller than a first diameter, and blocking off-axis portions of the beam greater than a second diameter that is larger than the first diameter. Thus, portions of the charged particle beam having a beam semi-angle that is greater than a lower limit greater than zero, and less than an upper limit greater than the lower limit, are allowed to pass to the exposure region on the substrate.

The method can further include detecting the axial position of the optimal image plane of the beam. The substrate can be moved along the axis as required to place the sensitive surface at the optimal image plane.

In an alternative embodiment, paraxial portions of the beam smaller than a first diameter are blocked. In addition, off-axis portions of the beam are blocked that are greater than a second diameter larger than the first diameter. Thus, portions of the charged particle beam having a beam semi-angle within a limited range not including a zero beam semi-angle are allowed to propagate to the sensitive surface. The method can include detecting the axial position of the optimal image plane of the beam. The beam is refracted and focused for forming an image of the illuminated region on the sensitive surface, and the optimal plane is adjusted to the sensitive surface. If the beam is an electron beam, the beam is preferably provided with a range of beam semi-angles in which the minimum beam semi-angle ($\alpha_{mask-min}$) at the reticle and the maximum beam semi-angle ($\alpha_{mask-max}$) at the reticle are 1.5 to 3.0 mrad. Further preferably, $|\alpha_{mask-min} - \alpha_{mask-max}| \leq 0.75$ mrad.

According to another aspect of the invention, CPB microlithography apparatus are provided that comprise, along an optical axis, an illumination-optical system, and a projection-optical system. As in other embodiments summarized above, the illumination-optical system is configured and situated so as to direct the charged particle beam from a source to the reticle and illuminate a region of the reticle with the beam. The projection-optical system is configured and situated relative to the reticle so as to direct the beam, passing through the illuminated region of the reticle, to the substrate so as to imprint an image of the illuminated region on a corresponding exposure region on the substrate. The projection-optical system also comprises a scattering aperture concentric with the optical axis. A first group of at least six deflectors (for aberration correction) is situated between the reticle and the scattering aperture, and a second group of at least three deflectors (also for aberration correction) is situated between the scattering aperture and the substrate. The deflectors in the first group and the deflectors in the second group can be either electromagnetic deflectors (energized by respective electrical currents applied to the deflectors) or electrostatic deflectors (energized by respective electrical voltages applied to the deflectors). The deflectors of the first and second groups are preferably independently energizable so as to cause the beam to assume a trajectory in which deflection-induced aberrations are corrected, such as exposure-region image plane inclination, deflection coma, exposure-region astigmatism, chromatic aberration, and exposure-region secondary distortion. In any event, the beam is caused to pass centrally through the scattering aperture to a target exposure region on the substrate, at which exposure region the beam has a zero angle of incidence.

The apparatus can include a device, disposed upstream of the substrate or upstream of the reticle, for limiting the beam semi-angle of the charged particle beam incident on the substrate to within a range greater than a lower limit that is not zero and an upper limit greater than the lower limit. Such a device can be, for example, an aperture plate defining an annular aperture. If the device is located upstream of the reticle and if the beam is an electron beam, then the lower limit ($\alpha_{mask-min}$) is preferably 1.5 mrad and the upper limit ($\alpha_{mask-max}$) is preferably 3 mrad. Also, $|\alpha_{mask-min}-\alpha_{mask-max}|$ is preferably less than or equal to 0.75 mrad. Furthermore, if the beam is an electron beam, the projection-optical system preferably satisfies the conditions:

$$AL^a(I_{illum}/4)^b/[V^c(\alpha_{wafer-max})^d] \leq 40-2.5(\alpha_{wafer-max}-10)$$

$$I_{illum} \geq 70 \ \mu A$$

$$V \leq 200 \ KeV$$

$$L \geq 300 \ mm$$

wherein $I_{illum}$, L, V, $\alpha_{wafer-max}$, A, a, b, c, and d are defined above. By satisfying these expressions, blurring due to random scattering caused by Coulombic repulsion is made dependent on the value of $\alpha_{wafer-max}$, and can be decreased to around 35 to 50 nm.

Apparatus and methods according to the invention are especially capable of achieving pattern resolutions of less than 100 nm, including resolutions of, e.g., 90 nm or less. Throughput is not compromised because a high-current beam can be used.

Apparatus and methods according to the invention are also especially suitable for projection-transfer of patterns defined on a segmented reticle on which the pattern is divided into exposure regions such as subfields or stripes.

The limit value $\alpha_{mask-min}$ is preferably 1.5 mrad or more for an electron beam because, if the value were less than 1.5 mrad, the percentage of electrons at the center of the angular distribution would be too high to achieve the desired effect of annular illumination. This, in turn, would increase blurring due to space-charge effects and would make it difficult to achieve the target resolution of 90 nm. The limit value amask-max is preferably 3 mrad or less because, if the value were greater than 3 mrad, then geometric aberrations generated by the projection-optical system would be too great to achieve the target resolution of 90 nm (even if the Coulomb effect can be adequately suppressed).

$|\alpha_{mask-min}-\alpha_{mask-max}|$ was limited to 0.75 mrad or less because, if this value were exceeded, the annular illumination of the reticle would be too wide, thereby diminishing the beneficial effects of annular illumination. This, in turn, would increase blurring due to space-charge effects and make it difficult to achieve the target resolution of 90 nm.

With an electron beam, the beam current ($I_{illum}$) as incident to the reticle surface is preferably set at 70 $\mu A$ or greater to provide sufficient beam current for acceptable throughput. It is also preferable that the beam-acceleration voltage (V) be high to reduce blurring due to Coulombic repulsion. However, the sensitivity of electron-beam resists drops radically and the processing capacity is too low when the beam-acceleration voltage V exceeds 200 keV. Therefore, the beam current for an electron beam is preferably no greater than 200 keV.

In addition, blurring is acceptably low if the distance L between the mask and the substrate is minimal. However, for electron-beam systems, it is preferred that the distance L be at least 300 mm to avoid problems due to excessive electrical current being supplied to the lenses in the illumination-optical system and projection-optical system (which excessive current leading to problems with excessive heating).

The foregoing and additional features and advantages of the invention will be more readily apparent from the following detailed description, which proceeds with reference to the accompanying drawings.

BRIEF DESCRIPTION OF THE DRAWINGS

FIG. 15($b$) schematically depicts, with respect to the Second Representative Embodiment, achieving coincidence of the focal position on the substrate surface using a correction lens.

DETAILED DESCRIPTION

General principles of the invention are described below in connection with multiple representative embodiments and examples.

First Representative Embodiment

Figure 4:
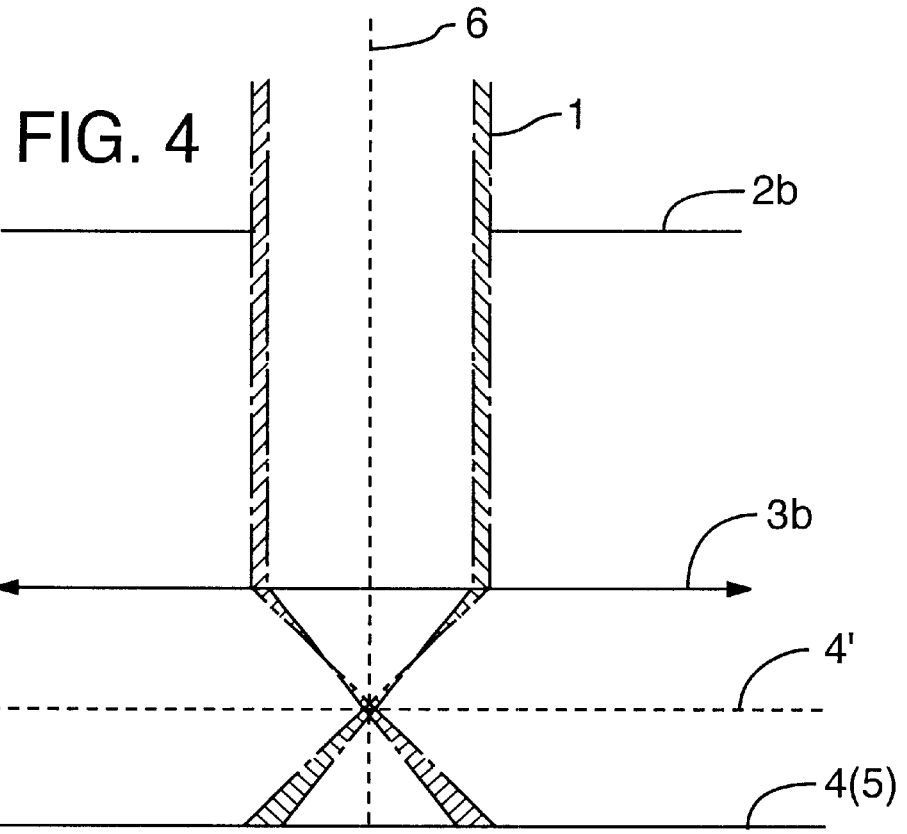
FIG. 4 illustrates a principle of spherical-aberration reduction according to the present invention, especially as employed in the First Representative Embodiment.
Figure 5:
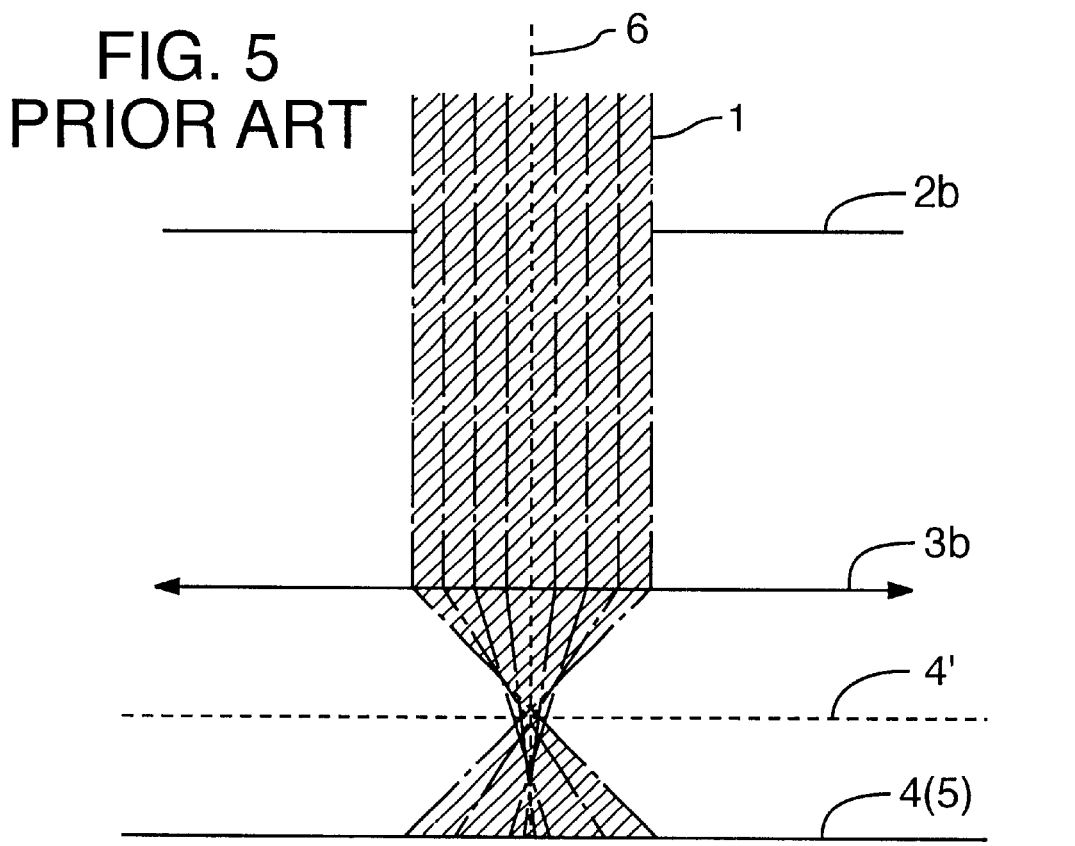
FIG. 5 illustrates, for purposes of comparison with FIG. 4, the spherical aberration exhibited by a conventional CPB microlithography apparatus.

Underlying principles of spherical aberration reduction according to this embodiment are shown in FIG. 4 which can be compared to a corresponding conventional situation shown in FIG. 5. In FIGS. 4 and 5, the charged particle beam 1 propagates along an optical axis 6 through a scattering aperture 2b and through a projection lens 3b to a surface of a substrate ("wafer") 5. The Gaussian image plane (i.e., image plane of paraxial rays) is denoted by the numeral 4, and 4' is the plane on which spherical aberration is minimal; thus, the plane 4' is an "optimal image plane."

In FIG. 5, the conventional situation is shown, and components that are the same as in FIG. 4 have the same reference designators. In FIG. 5, spherical aberration is the primary aberration. At the optimal image plane 4', located objectwise of the Gaussian image plane 4, spreading of the charged particle beam due to spherical aberration is minimal. In the conventional situation shown in FIG. 5, spherical aberration can be decreased somewhat by shifting the position of the wafer 5 from the Gaussian image plane 4 to the optimal image plane 4'. However, such a maneuver will not sufficiently reduce spherical aberration.

According to this embodiment, spherical aberration can be markedly reduced at the optimal image plane 4' by eliminating paraxial portions of the charged particle beam, as shown in FIG. 4. In other words, the charged particle beam can be manipulated such that only that portion of the beam having a beam semi-angle within a particular range of beam semi-angles is allowed to propagate to the optimal image plane 4'. By comparing FIG. 4 with FIG. 5, it readily can be seen that spherical aberration at the optimal image plane 4' is markedly diminished in FIG. 4.

Trimming the beam to allow passage only of portions within a certain range of beam semi-angle is performed in this embodiment using an aperture plate defining an appropriately shaped aperture. Also according to this embodiment, the location of the wafer stage is adjustable along the optical axis 6 so that the wafer surface can be optimally positioned to achieve proper placement of the best image at the optimal image plane 4' (wherein the optimal image plane 4' herein is also termed the "imaging surface").

In addition to reducing spherical aberration, passage of portions of the charged particle beam having a large beam semi-angle also reduces image blurring due to the Coulomb effect. In addition, use of an aperture is a simple way to limit the beam semi-angle, thereby avoiding problems inherent in the use of multi-pole lenses. Also, image blurring due to the Coulomb effect inherent with the use of multi-pole lenses is avoided.

A suitable aperture can have a configurations, so long as the aperture allows passage, to the imaging surface, of portions of the charged particle beam having a beam semi-angle that is greater than a specified lower limit and less than a specified upper limit.

Second Representative Embodiment

Figure 6:
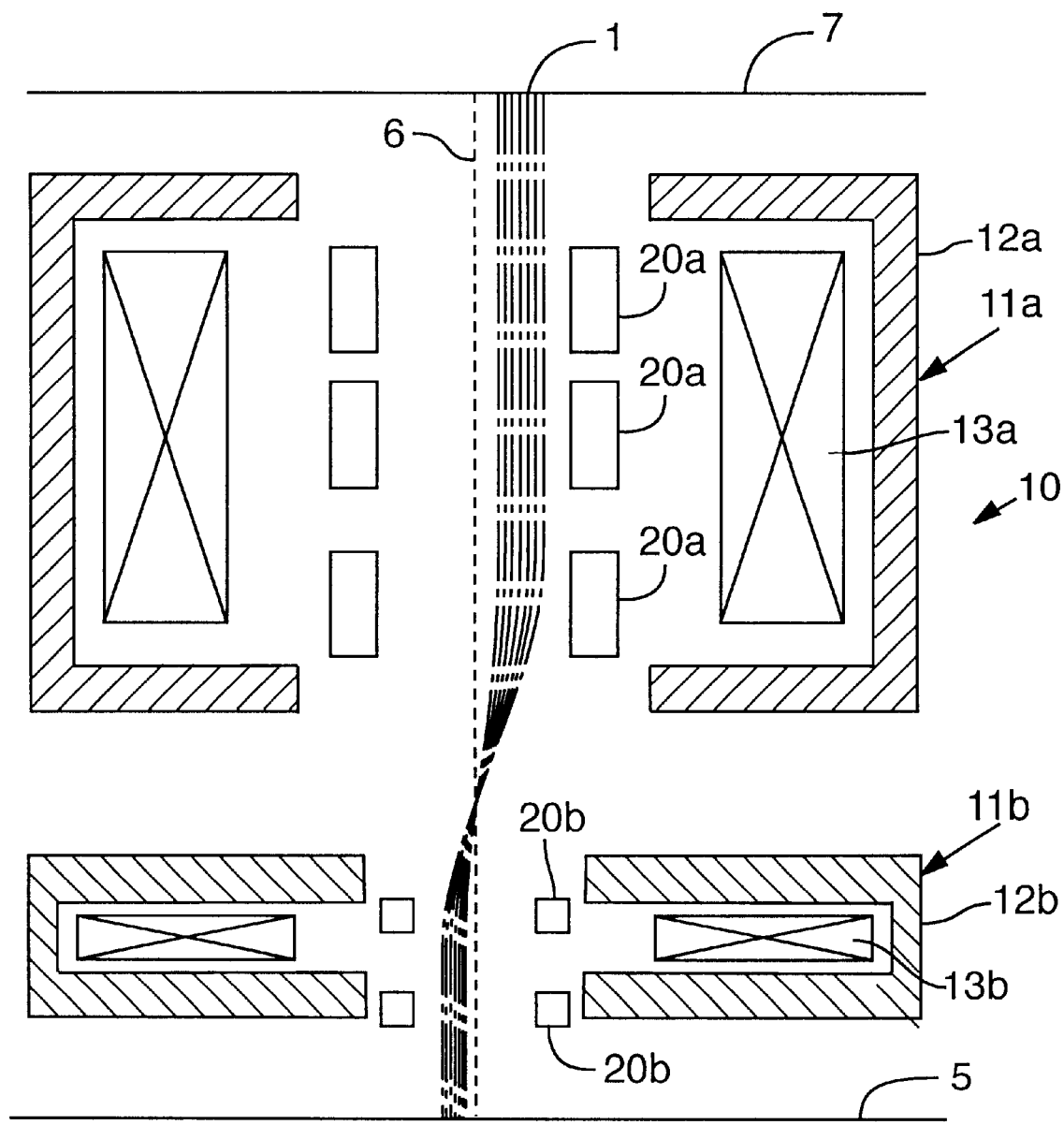
FIG. 6 is an optical diagram of a projection-optical system for a CPB microlithography apparatus according to the Second Respective Embodiment.

FIG. 6 shows a projection-optical system that comprises an electromagnetic Symmetric Magnetic Doublet (SMD) lens 10. With SMD lenses the primary aberration is spherical aberration. The SMD lens 10 comprises a first projection lens 11a and a second projection lens 11b. The charged particle beam 1 (e.g., electron beam) passes along the optical axis 6 from the reticle 7 through the first projection lens 11a and through the second projection lens 11b to the substrate 5. The first projection lens 11a comprises a magnetic-flux conduit 12a enclosing a coil 13a, and the second projection lens 11b comprises a magnetic-flux conduit 12b enclosing a coil 13b. By way of example, the SMD lens 10 has a "demagnification ratio" of ¼, by which is meant that the pattern image formed by the SMD lens 10 is 4× smaller than the pattern as defined by the reticle 7. Each of the projection lenses 11a, 11b includes respective deflectors 20a, 20b. The deflectors 20a, 20b deflect the beam 1 to effect aberration control as required and to cause the beam 1 to form an image of the illuminated portion of the reticle 7 on the proper location on the substrate 5. In FIG. 6, no aperture for controlling the beam semi-angle of the beam 1 is shown.

By way of example, the maximum beam semi-angle of the beam 1 at the substrate 5, as exhibited by the system shown in FIG. 6, is large at 17 mrad. However, image blurring at the substrate 5 (i.e., at the Gaussian image plane) due to lens aberrations is 308 nm, which is impractical for a microlithography exposure apparatus intended for use in transferring patterns with features having linewidths of about 100 nm. The spherical aberration (the principal aberration among the lens aberrations) is 293 nm.

Figure 7:
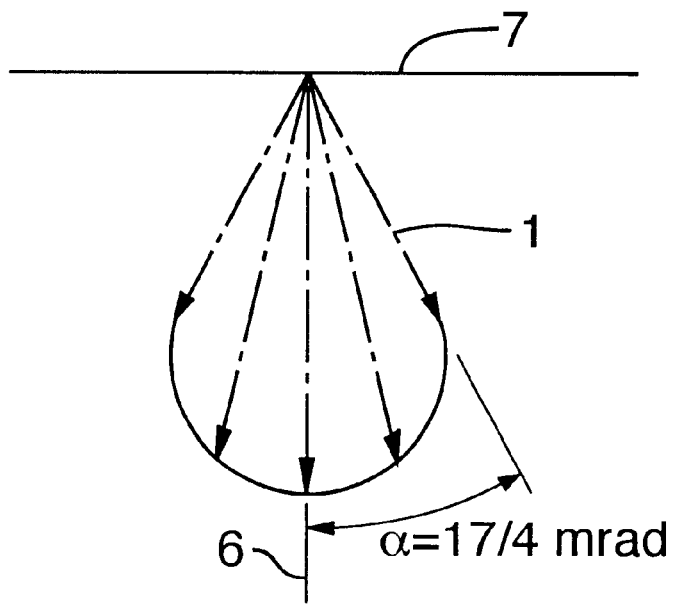
FIG. 7 is a schematic depiction, for purposes of comparison with FIG. 8, of the distribution of the beam semi-angle just downstream of the reticle in a conventional electron-beam microlithography apparatus.
Figure 8:
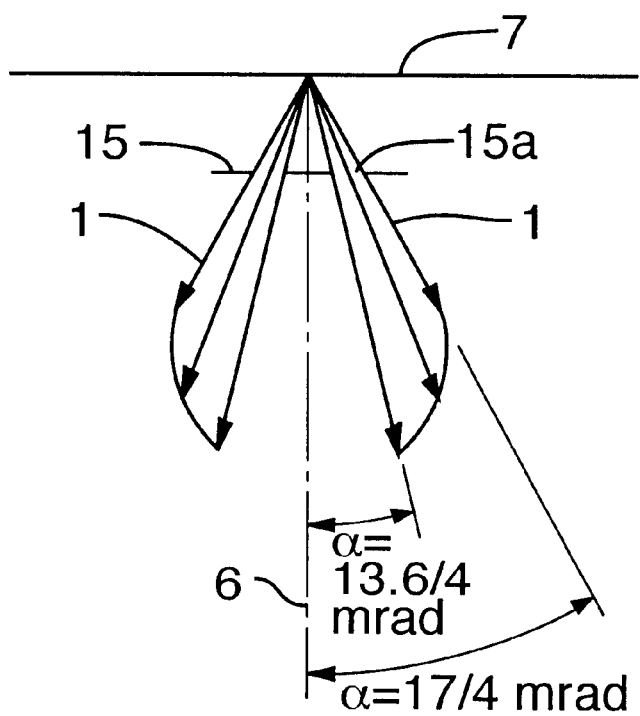
FIG. 8 illustrates the distribution of the beam semi-angle just downstream of the reticle in the Second Representative Embodiment.

According to this embodiment, the FIG. 6 system preferably includes an annular aperture plate 15 (not shown in FIG. 6, but discussed below with respect to FIG. 8) situated downstream of the reticle 7. FIGS. 7 and 8 depict representative distributions of the charged particle beam 1, wherein FIG. 7 depicts the conventional situation, and FIG. 8 depicts a situation resulting from placement of an annular aperture according to this representative embodiment. Each of FIGS. 7 and 8 shows the reticle 7 and divergence of the beam 1 just downstream of the reticle 7. FIG. 8 depicts an aperture plate 15 defining an annular aperture 15a situated downstream of the reticle 7.

In FIG. 7, no annular aperture 15a is present, and the charged particle beam 1 exhibits a nearly Gaussian distribution of divergence with a beam semi-angle of 0 mrad to 17 mrad. By shifting the image plane from the Gaussian image plane to the optimal image plane in a manner as shown in FIG. 4, image blurring exhibited by the FIG. 7 configuration due to spherical aberration could be reduced about 4-fold, yielding a spherical aberration of about 73 nm. Nevertheless, whenever the beam 1 in the FIG. 7 configuration is deflected by 1 mm at the image plane, blurring due to lens aberrations increases to 117 nm, which is excessive for achieving a 100-nm critical dimension.

In contrast, according to this embodiment, by inserting the aperture plate 15 (defining the annular aperture 15a) to restrict the beam semi-angle to between 13.6 mrad and 17 mrad, as shown in FIG. 8, blurring at the optimal image plane due to spherical aberration is reduced to 0.16(293 nm)=56 nm, and blurring due to lens aberrations is reduced to 106 nm.

By restricting the beam semi-angle even further to the range 15.3 mrad to 17 mrad using the aperture 15a, blurring at the optimal image plane due to spherical aberration can be reduced even further, to 0.09(293 nm)=26 nm. In such an instance, blurring due to lens aberrations is reduced to 91 nm which is capable of producing the desired 100-nm linewidth resolution.

Another advantage of restricting the beam semi-angle to the range 15.3 mrad to 17 mrad is that image blurring due to the Coulomb effect is vastly repressed, to about 40 nm with a 25-$\mu$A beam current. Thus, such blurring is small in proportion to the large beam current. The net blurring due to lens aberrations and the Coulomb effect in such an instance is 99 nm, which is still capable of producing a 100-nm linewidth resolution. The contributions of other aberrations (i.e., other than spherical aberrations) resulting from use of the annular aperture 15a are sufficiently small as to be negligible.

Figure 9:
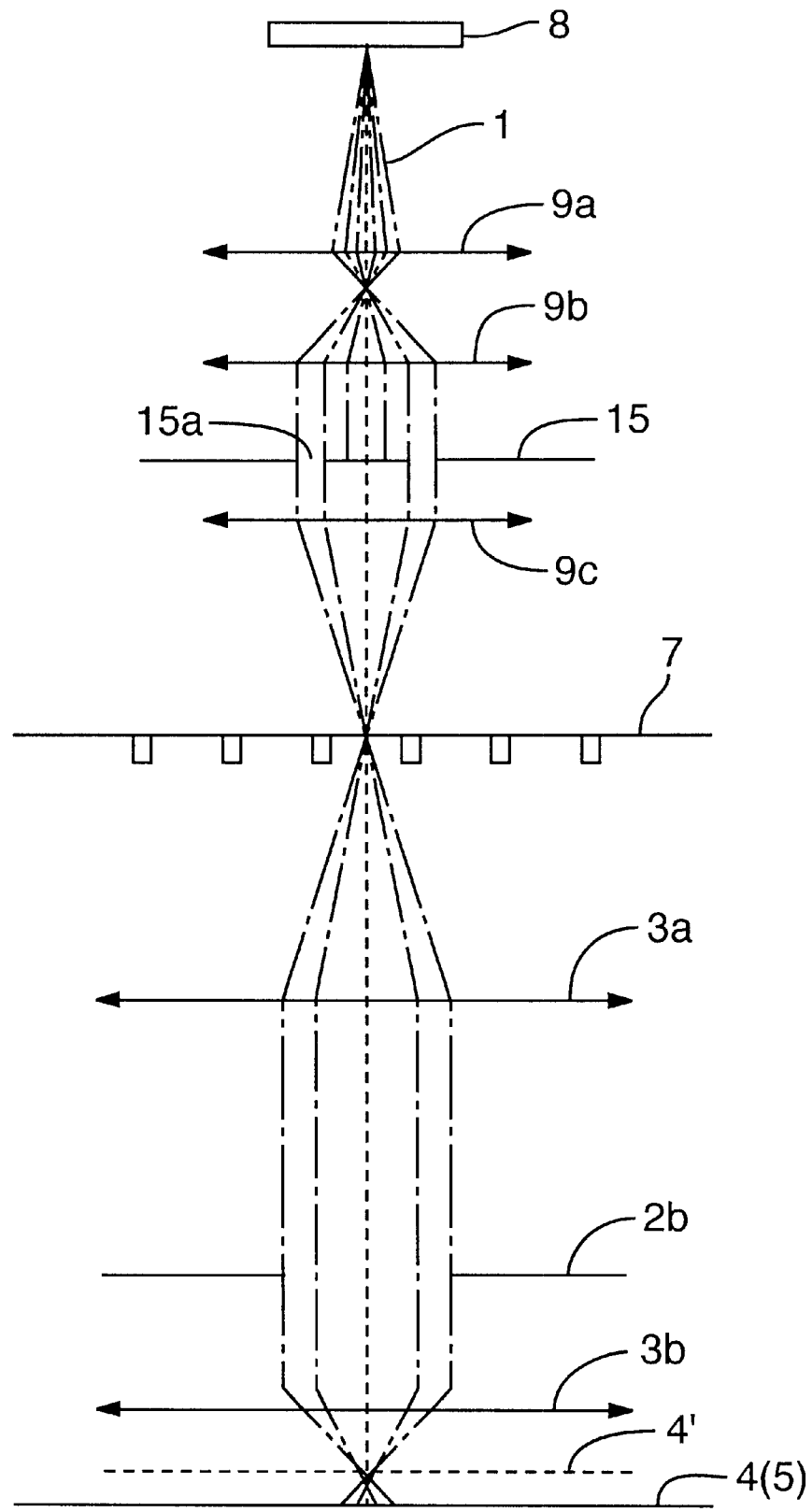
FIG. 9 is a schematic optical diagram illustrating a first example axial location at which an annular aperture 15$a$ can be placed, as described in connection with the Second Representative Embodiment.
Figure 10:
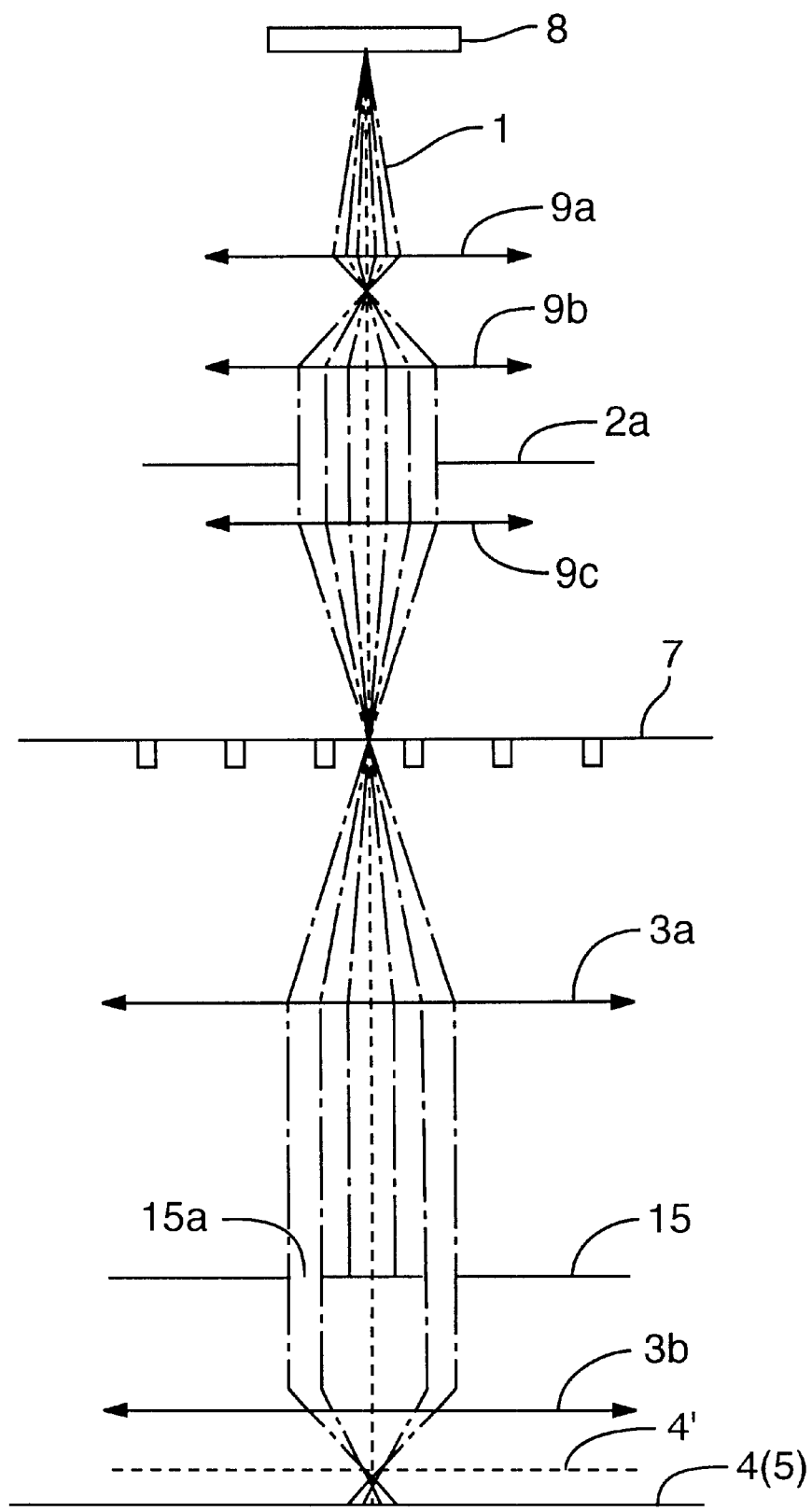
FIG. 10 is a schematic optical diagram illustrating a second example axial location at which an annular aperture 15$a$ can be placed, as described in connection with the Second Representative Embodiment.

The aperture plate 15 can be placed anywhere along the optical axis 6 so long as the placement position is a "stop" position for the beam 1. FIGS. 9 and 10 depict respective exemplary axial locations at which the aperture plate 15 can be inserted. (In FIGS. 9 and 10, components that are the same as shown in FIG. 1 have the same reference designators.)

Figure 1:
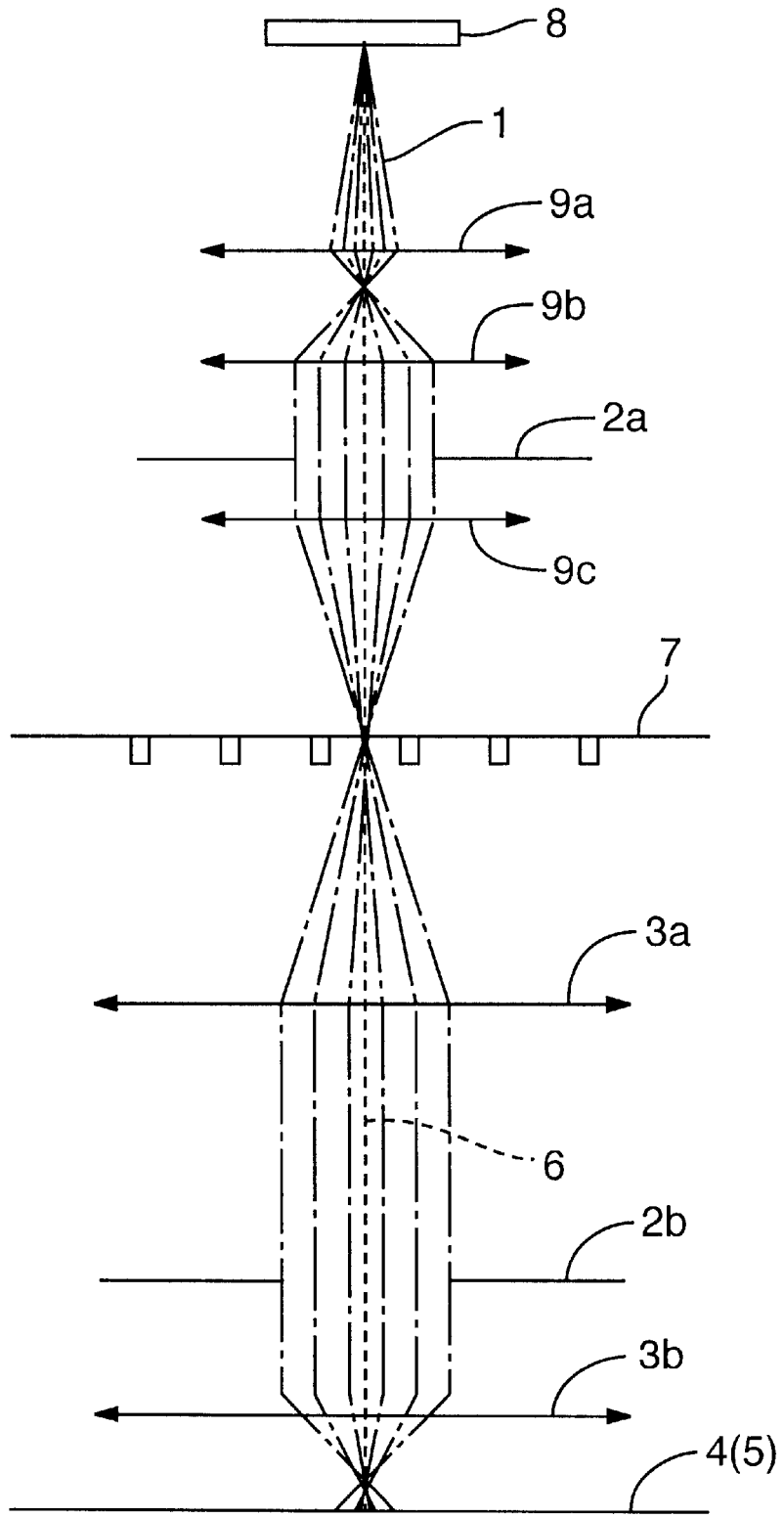
FIG. 1 is a schematic optical diagram showing general features of a conventional charged-particle-beam (CPB) microlithography apparatus.
Figure 2:
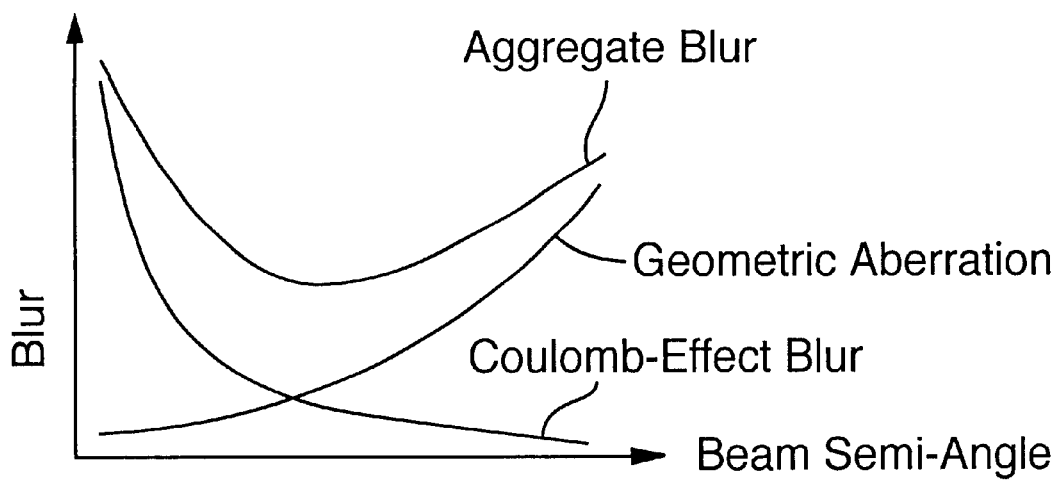
FIG. 2 is a graph showing relationships between the beam semi-angle and blurring in a conventional electron-beam microlithography apparatus.

More specifically, in FIG. 9, the aperture plate 15 (defining the annular aperture 15a) is situated at the position that, in FIG. 1, is occupied by the crossover aperture 2a. As the beam propagates from the CPB source 8, the beam is collimated by passage through the second condenser lens 9b. The aperture plate 15 is located within the axial region between the second and third condenser lenses 9b, 9c, respectively, where the beam is collimated. Only that portion of the beam 1 having a beam semi-angle within the specified range is allowed to pass through the annular aperture 15a and form an image at the optimal image plane 4'. For imaging, either the substrate 5 can be moved upward as required to the optimal image plane 4' or the optimal image plane 4' can be shifted downward as required to the substrate 5 using a corrective lens.

In FIG. 10, the aperture plate 15 (defining the annular aperture 15a) is situated between the two projection lenses 3a, 3b within another axial region in which the beam 1 is collimated. The annular aperture 15a allows passage therethrough of portions of the beam having a beam semi-angle within the specified range. The image is formed at the optimal image plane 4'. Again, for imaging, either the substrate 5 can be moved upward as required to the optimal image plane 4', or the optimal image plane 4' can be shifted downward as required using a corrective lens.

The scheme shown in FIG. 9 is more preferred than the scheme shown in FIG. 10 because the FIG. 9 scheme exhibits better reduction of the Coulomb effect.

Although the aperture 15 is denoted as "annular", the annularity can be manifest in any of various ways so long at the aperture performs the necessary restriction of the beam semi-angle of the beam at the surface on which the image is formed. Representative examples are shown in FIGS. 11 and 12.

Figure 11:
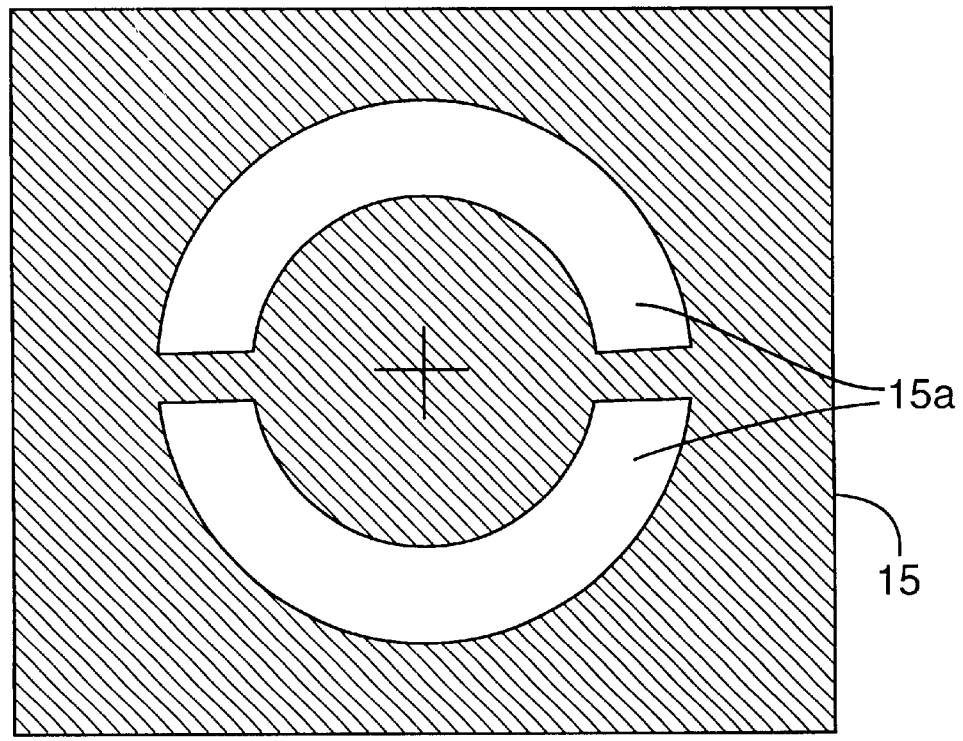
FIG. 11 is a plan view of a first exemplary annular aperture as described in connection with the Second Representative Embodiment.

In FIG. 11, the aperture 15a is defined as a substantially donut-shaped opening in the aperture plate 15. Portions of the beam impinging on the central portion of the aperture plate 15 are blocked; such portions have beam semi-angles that are smaller than the desired range. Similarly, portions of the beam impinging on the outer portions of the aperture plate 15 are blocked; such portions have beam semi-angles that are larger than the desired range. The aperture 15a is actually two semicircular annular portions to allow support of the inner portion of the aperture plate 15.

Figure 12:
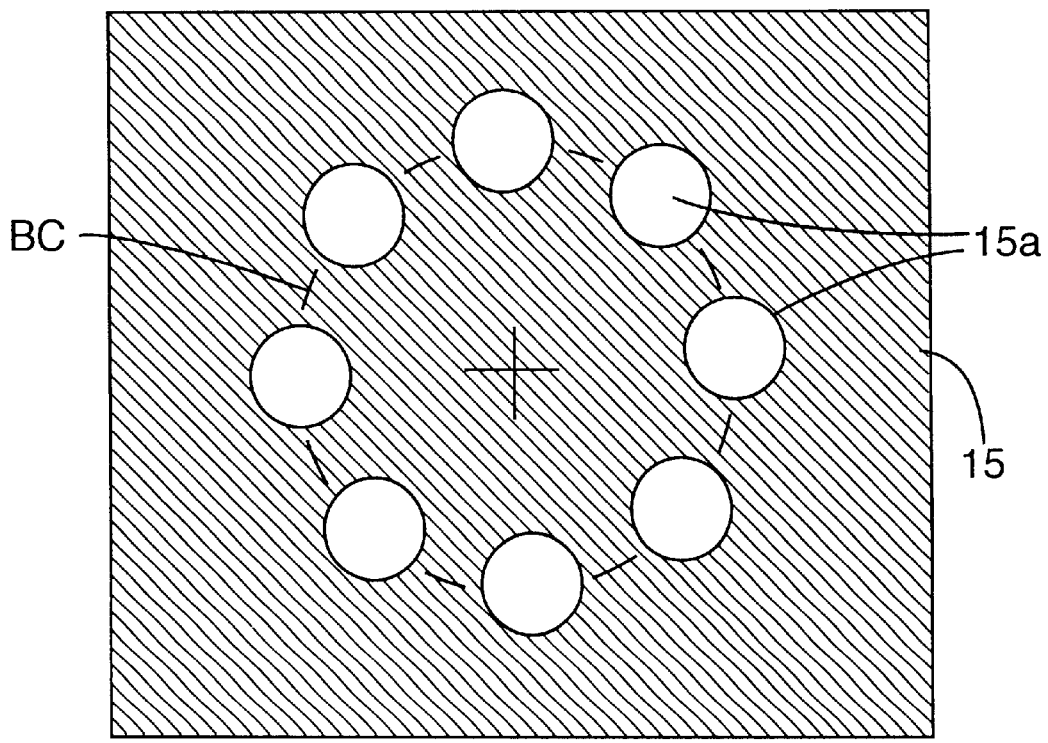
FIG. 12 is a plan view of a second exemplary annular aperture as described in connection with the Second Representative Embodiment.

In FIG. 12, the aperture 15a is defined by multiple circular openings arranged on a "bolt circle" BC in the aperture plate 15. The openings are arranged radially equi-angularly such that the center of each circular opening is on the bolt circle. Aperture plates 15 such as those shown in FIGS. 11 and 12 have a simple structure that is easily manufactured.

Figure 13:
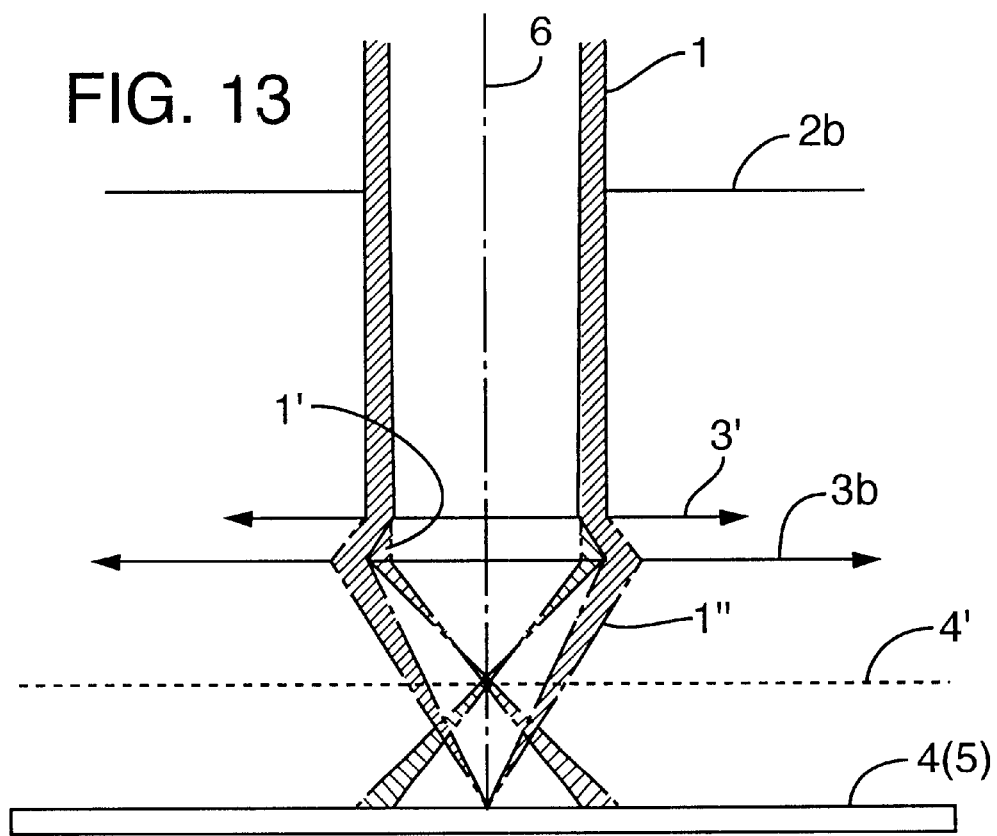
FIG. 13 is a schematic elevational view of an exemplary method for aligning the optimal image-plane position with the substrate surface using a corrective lens, as described in connection with the Second Representative Embodiment.
Figure 14:
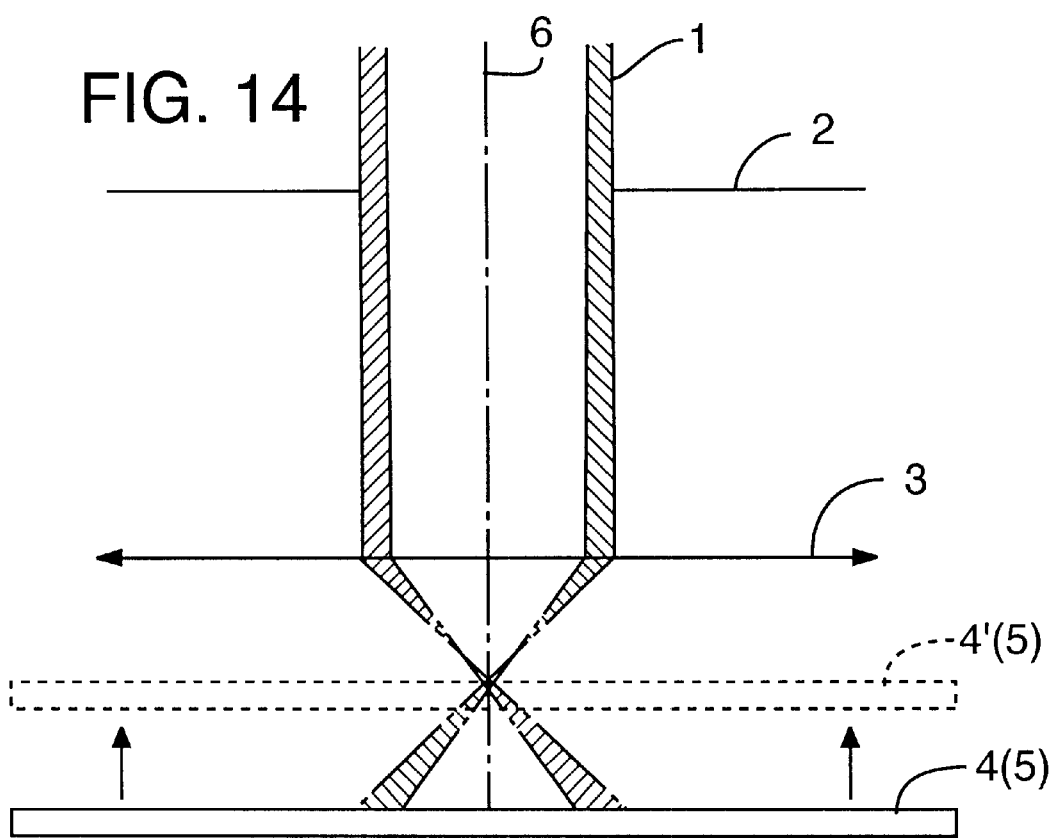
FIG. 14 is a schematic elevational view of an exemplary method for aligning the optimal image-plane position with the substrate surface by shifting the substrate position along the optical axis, as described in connection with the Second Representative Embodiment.

Examples of methods for aligning the substrate 5 with the optimal image plane 4' are shown in FIGS. 13 and 14.

In FIG. 13, the charged particle beam before correction is denoted by the numeral 1', and the charged particle beam after correction is denoted by the numeral 1". The numeral 3' designates a corrective lens. The uncorrected beam 1' (with its focal point convergent at the optimal image plane 4') becomes the corrected beam 1" by placement of the corrective lens 3' such that the focal point of the beam converges at the surface of the substrate 5. In other words, the optimal image plane 4' is shifted to the position of the Gaussian image plane 4. Thus, the substrate 5 is placed at the optimal image plane even if the substrate 5 itself cannot be moved.

In FIG. 14, the substrate 5 is axially shifted to the position of the optimal image plane 4' to align the focal point of the beam with the surface of the substrate 5. In this configuration, no corrective lens 3' is used.

A first exemplary method for finding the position of the optimal image plane 4' involves actually exposing and developing patterns using a dummy substrate (wafer) while variously changing the height of a stage on which the substrate 5 is mounted during exposure. The exposed patterns can be observed using a scanning electron microscope (SEM). By observing the SEM images, the height of the substrate 5 at which the best image resolution is obtained is designated the optimal image plane 4'.

In a second exemplary method, reference marks are provided on the substrate stage or on a calibration wafer. The reference marks are scanned by an electron beam and the reflected signal is detected. The first differential of the signal amplitude with respect to scan position is determined, and the magnitude of blurring is determined from a plot of the differential values. The differential values are obtained while changing the height of the substrate stage, and the substrate height at which the amount of blur is within a desired range or is at a minimum is regarded as the optimal image plane 4'.

In contrast to the two methods above in which positioning of the substrate surface at the optimal image plane is performed by changing the height of the substrate stage, other exemplary methods for positioning the substrate surface at the optimal image plane involve use of a corrective lens, as discussed earlier. Determinations of where to position the lens along the optical axis 6 can be made by methods similar to the two described above with respect to positioning the substrate.

Further with respect to this embodiment, by using a CPB projection-optical system characterized by a relatively narrow annular illumination, only those charged particles of the illuminating charged particle beam having a relatively large aperture half-angle distribution are used for actual exposure. In such a distribution of charged particles, the average relative distance between charged particles passing through the annular aperture is increased relative to the FIG. 1 configuration. Consequently, the average Coulombic repulsion acting on any charged particle propagating through the annular aperture is decreased, thereby reducing blurring due to Coulombic repulsion compared with conventional apparatus such as the FIG. 1 apparatus.

Figure 3A:
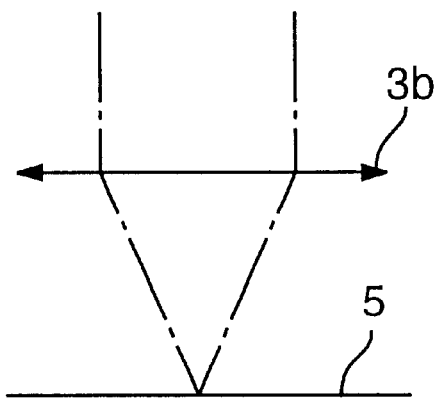
FIGS. 3($a$)–3($b$) show a representative shift in focal position exhibited by conventional CPB microlithography apparatus with a change from a low beam current (FIG. 3($a$)) to a high beam current (FIG. 3($b$)).
Figure 3B:
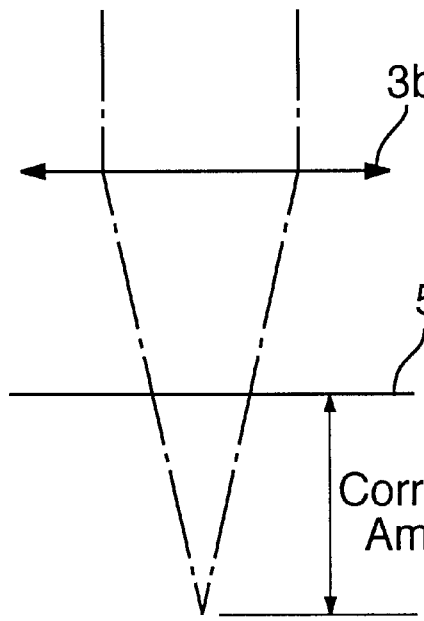
Figure 15A:
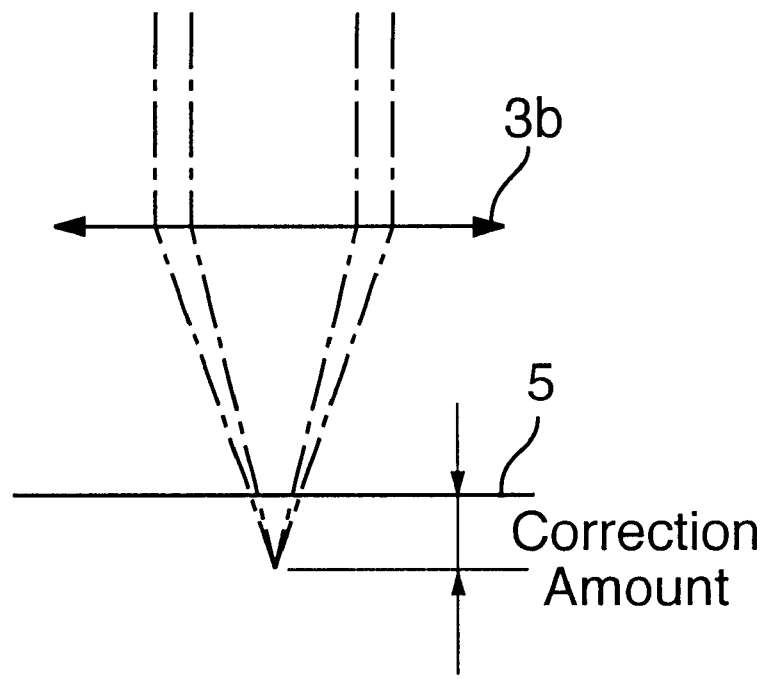
FIG. 15($a$) schematically depicts, when compared with FIG. 2, a reduction of focal displacement realized with the Second Representative Embodiment.
Figure 15B:
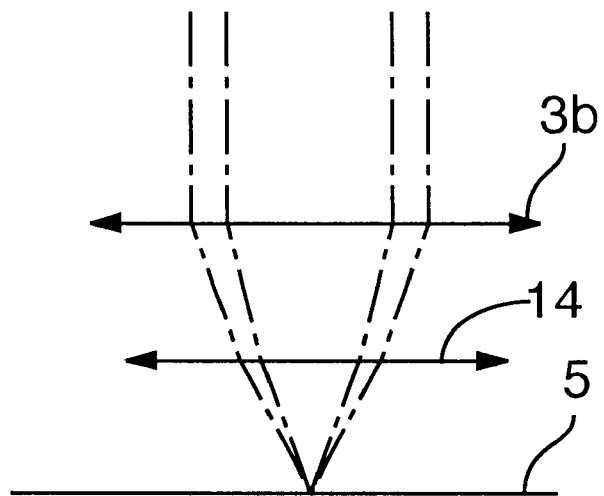

Also, since the aperture 15a is annular, charged particles allowed to pass through the annular aperture do not have small (close to zero) beam semi-angles. Consequently, the charged particles impinging on the substrate have relatively large beam semi-angles, which achieves a marked suppression of the space-charge effect. For example, focal displacement is one type of space-charge effect that, in this embodiment, is significantly reduced compared to conventional CPB microlithography apparatus. This suppression is shown in FIGS. 15(a)–15(b). Turning first to FIG. 15(a), it can be seen that the amount of focal displacement exhibited by this representative embodiment is substantially reduced compared to the focal displacement shown in FIG. 3(b) (in each of FIGS. 15(a) and 3(b), the respective charged particle beams have the same beam current to allow a meaningful comparison).

The displacement shown in FIG. 15(a) can be further corrected using a correction lens 14 situated downstream of the second projection lens 3b, as shown in FIG. 15(b). Since the range of required correction of the focal displacement is small, the corrective lens 14, if used, can have a relatively simple configuration.

Figure 16A:
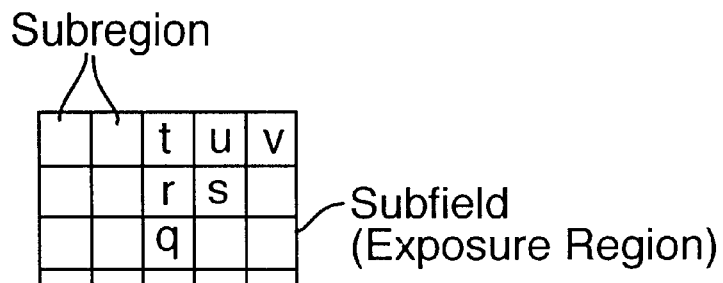
FIG. 16($a$) is a plan view schematically depicting an exposure unit as defined on a reticle. Each of the subregions denoted "q", "r", "s", "t", "u", "v", . . . is a portion of the exposure unit.
FIG. 16(b) is a plot, for comparison with FIG. 16(c), of blurring (due to space-charge effects) exhibited by a conventional electron-beam microlithography apparatus when the exposure units of FIG. 16(a) are projected onto the substrate.
FIG. 16(c) is a plot of blurring (due to space-charge effects) exhibited by the Second Representative Embodiment when the exposure units of FIG. 16(a) are projected onto the substrate.
Figure 16B:
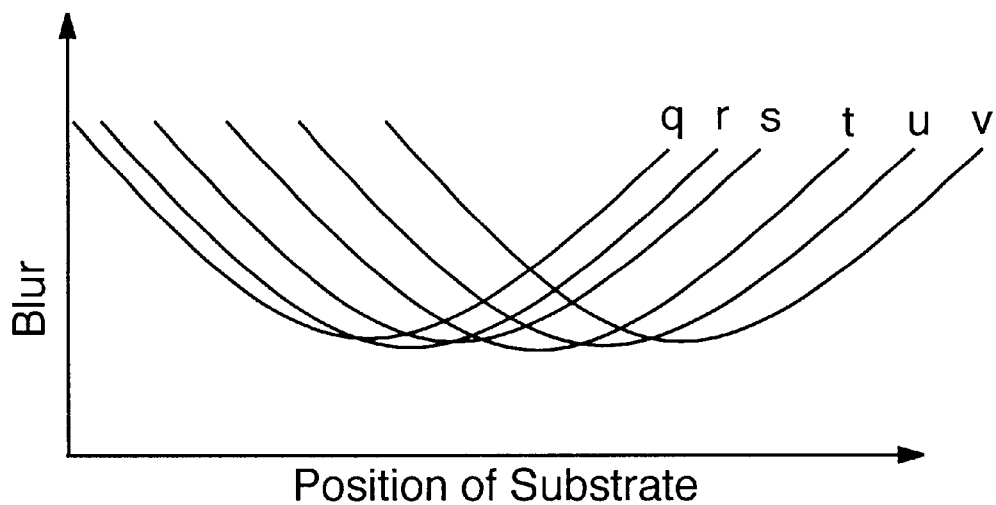
Figure 16C:
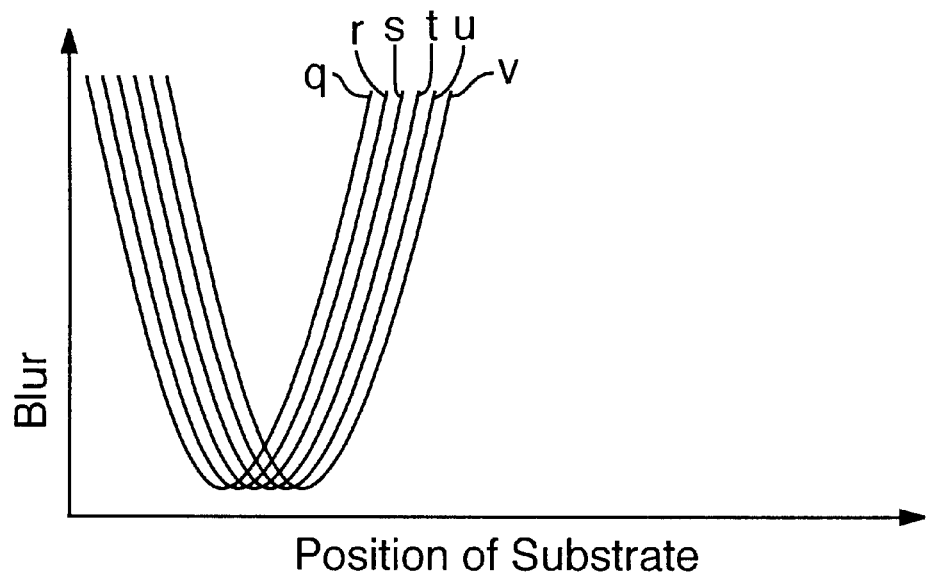

This representative embodiment is also effective at suppressing field curvature of the image plane due to space-charge effects. This suppression is illustrated in FIGS. 16(a)–16(c). FIG. 16(a) depicts an exemplary exposure unit (e.g., a subfield). Regions q, r, s, t, u, v are subregions in an exposure unit defined here for convenience (these subregions are not actual structures on a reticle). Here, blur difference within an exposure region (subfield) is discussed by comparing blur at the subregions q–v. In FIGS. 16(b) and 16(c), the ordinate is the magnitude of blur and the abscissa is the axial position of the substrate. With a conventional CPB microlithography apparatus in which no annular aperture is used, the space-charge effect is depicted in FIG. 16(b), which depicts a wide spread of optimal positions of blurring for each of the subregions q–v. The respective minima of the curves represent respective substrate positions at which blurring is minimal. FIG. 16(c) shows results obtained using an apparatus according to this representative embodiment, wherein the spread of blurring is much more limited than that shown in FIG. 16(b). In FIG. 16(c), since the respective positions of the substrate at which blurring is minimal for the regions q–v are much closer together than in FIG. 16(b), blurring can be minimized for more of the regions q–v by positioning the substrate 5 at a position at which the minima are clustered.

Field curvature of the image plane within an exposure region (subfield) due to the space-charge effect cannot be corrected by normal image-correction methods. As a result of the space-charge effect on conventional apparatus, the focal-plane position at which resolution is optimal varies from location to location within an exposure region especially whenever a large beam current is used. This results in a substantial reduction in resolution. With the present embodiment, in contrast, field curvature of the image plane due to the space-charge effect is suppressed even when using a high beam current.

This embodiment is also superior, relative to conventional apparatus, in suppressing image distortion due to the space-charge effect. With conventional methods and apparatus, such distortion can deform the image in a manner that is difficult to correct by normal image-correction methods. As a result, the accuracy with which contiguous features in adjacent exposure regions can be stitched together on the substrate can be seriously degraded, especially at high beam currents. This phenomenon also adversely affects the accuracy with which patterns in multiple layers on the substrate can be connected together (i.e., the "overlay accuracy"). By suppressing space-charge effects, the present embodiment exhibits substantially less distortion, thereby allowing patterns to be transferred with greater accuracy and resolution.

Third Representative Embodiment

Figure 17:
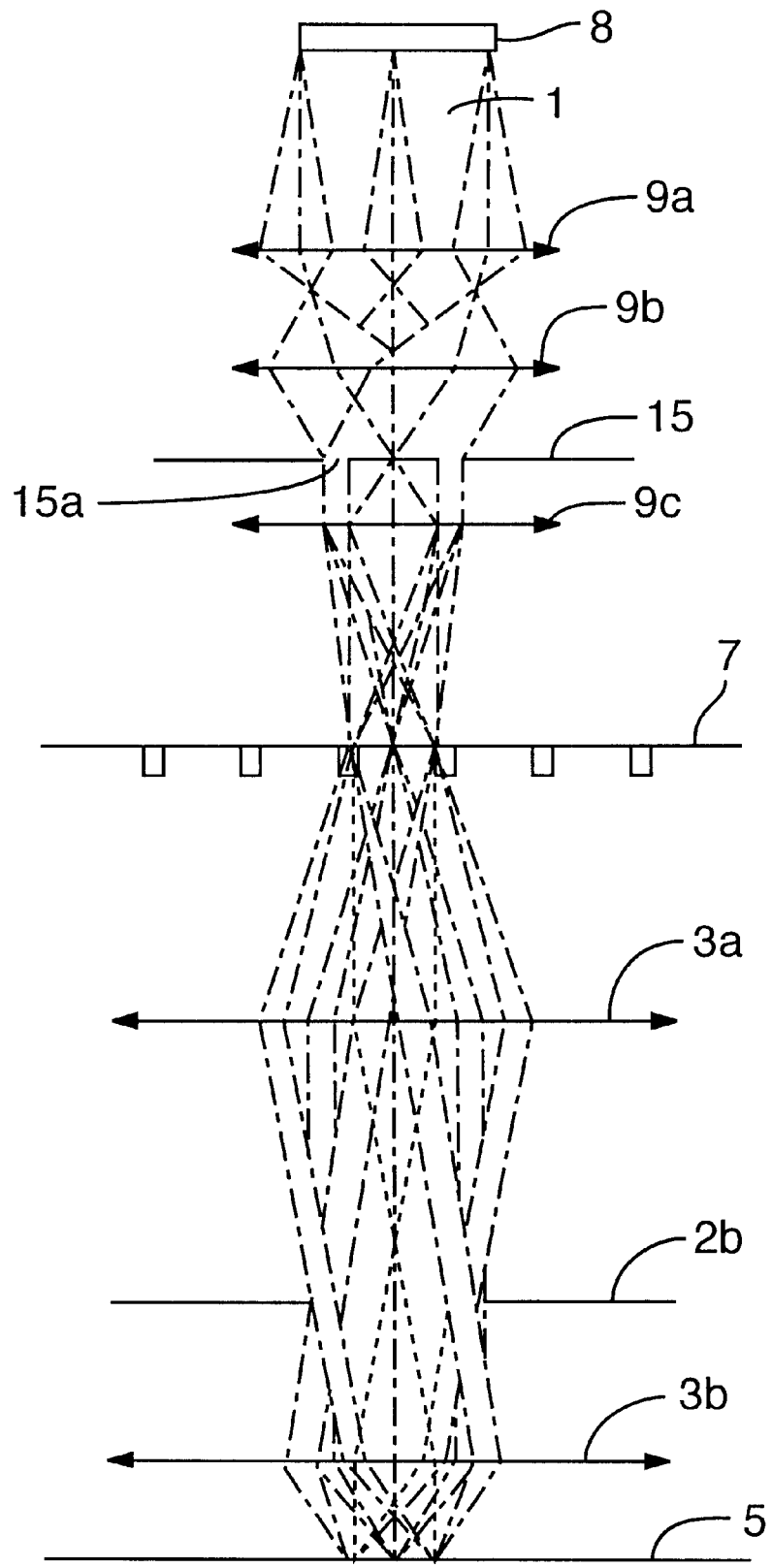
FIG. 17 is a schematic optical diagram showing certain general aspects of a CPB microlithography apparatus according to the Third Representative Embodiment.

Certain general aspects of this embodiment are similar to those of the second representative embodiment shown in FIG. 10 and are not described further. Reference is made to FIG. 17 which depicts those general aspects as represented by the propagation of three ray bundles emitted from three different positions on a charged-particle gun 8 (this example is implicitly directed to an embodiment utilizing an electron beam, in which item 8 is an electron-gun cathode plate) and by the placement of the aperture plate 15 (defining the "annular" aperture 15a) upstream of the reticle 7. The three ray bundles are shown for convenience. In an actual system, the beam is emitted from all over the plate 8.

Figure 18:
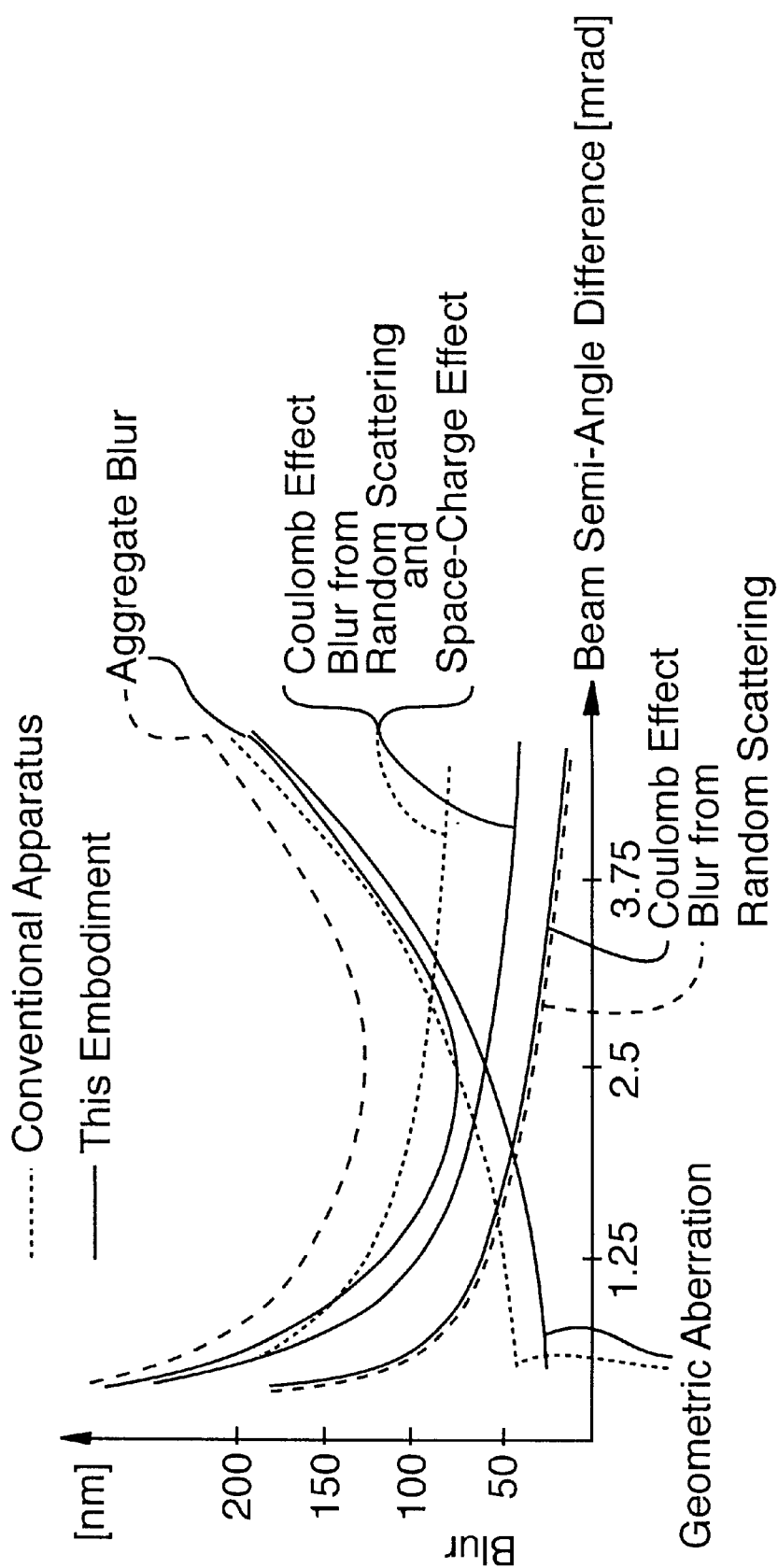
FIG. 18 depicts plots of the relationships between the beam semi-angle $\alpha_{wafer-max}$ at the substrate versus blurring as exhibited by the Third Representative Embodiment, compared to a conventional CPB microlithography apparatus.

Reference is now made to FIG. 18, which shows several plots of the relationships between image blurring and the beam semi-angle ($\alpha_{mask\text{-}max}$) relative to the optical axis 6 of the beam incident on the reticle surface. In FIG. 18, the solid-line curves were obtained with this embodiment, and the various dotted-line and dashed-line curves were obtained with a conventional CPB microlithography apparatus as shown, e.g., in FIG. 1.

The causes of blurring include (1) the Coulomb effect caused by random scattering, (2) geometric aberrations, and (3) space-charge effects. In FIG. 18, the summed blurring due to causes (1)–(3) is denoted as "aggregate" blurring. When the beam is an electron beam, aggregate blurring is smallest whenever the beam semi-angle ($\alpha_{mask\text{-}max}$) at the reticle ranges from 1.5 mrad to 3 mrad. Preferably, in this embodiment, $\alpha_{mask\text{-}min} = 0.8 \, (\alpha_{mask\text{-}max})$.

Various examples in connection with this representative embodiment are set forth below. In each of the following examples and comparison examples, the charged particle beam was an electron beam. Each exposure region ("subfield") on the wafer was either square in shape with an area from $(200 \, \mu m)^2$ to $(300 \, \mu m)^2$, or a rectangle having a similar range in area. The demagnification ratio was ¼. Here, the beam current at the substrate is assumed to be ¼ times smaller than the beam current at the reticle. This assumption arises from the assumption that the average feature density on the reticle is about 25% of the feature density on the substrate.

EXAMPLE 1

In this example, the distance from the reticle to the substrate ("L") was L=500 mm, the illumination intensity at the substrate ("$I_{illum}/4$") was $I_{illum}/4 = 20 \, \mu A$, the beam acceleration voltage ("V") was V=100 KeV, $\alpha_{wafer\text{-}min} = 8$ mrad, and $\alpha_{wafer\text{-}max} = 10$ mrad.

EXAMPLE 2

In this example, values of key parameters were as follows: L=500 mm, $I_{illum}/4 = 20 \, \mu A$, V=100 KeV, $\alpha_{wafer\text{-}min} = 7.2$ mrad, and $\alpha_{wafer\text{-}max} = 9$ mrad. Thus, $\alpha_{mask\text{-}min} = 0.8 \, \alpha_{mask\text{-}max}$.

EXAMPLE 3

In this example, values of key parameters were as follows: L=400 mm, $I_{illum}/4=25$ μA, V=100 KeV, $\alpha_{wafer-min}=9.6$ mrad, and $\alpha_{wafer-max}=12$ mrad.

EXAMPLE 4

In this example, values of key parameters were as follows: L=500 mm, $I_{illum}/4=25$ μA, V=100 KeV, $\alpha_{wafer-min}$8 mrad, and $\alpha_{wafer-max}=10$ mrad.

EXAMPLE 5

In this example, values of key parameters were as follows: L=400 mm, $I_{illum}/4=25$ μA, V=100 KeV, $\alpha_{wafer-min}=7$ mrad, and $\alpha_{wafer-max}=9$ mrad.

EXAMPLE 6

In this example, values of key parameters were as follows: L=450 mm, $I_{illum}/4=22.5$ μA, V=100 KeV, $\alpha_{wafer-min}=7$ mrad, and $\alpha_{wafer-max}=9$ mrad.

EXAMPLE 7

In this example, values of key parameters were as follows: L=450 mm, $I_{illum}/4=22.5$ μA, V=100 KeV, $\alpha_{wafer-min}=8$ mrad, and $\alpha_{wafer-max}=10$ mrad.

EXAMPLE 8

In this example, values of key parameters were as follows: L=500 mm, $I_{illum}/4=25$ μA, V=120 KeV, αwafer-min=8 mrad, and $\alpha_{wafer-max}=10$ mrad.

EXAMPLE 9

In this example, values of key parameters were as follows: L=500 mm, $I_{illum}/4=25$ μA, V=100 KeV, αwafer-min=7 mrad, and $\alpha_{wafer-max}=9$ mrad.

Comparison Example 1

In this comparison example, values of key parameters were as follows: L=600 mm, $I_{illum}/4=25$ μA, V=100 KeV, $\alpha_{wafer-min}=0$ mrad, and $\alpha_{wafer-max}=6$ mrad.

Comparison Example 2

In this comparison example, values of key parameters were as follows: L=500 mm, $I_{illum}/4=25$ μA, V=100 keV, $\alpha_{wafer-min}=0$ mrad, and $\alpha_{wafer-max}=6$ mrad.

Comparison Example 3

In this comparison example, values of key parameters were as follows: L=500 mm, $I_{illum}/4=25$ μA, V=100 keV, $\alpha_{wafer-min}=4$ mrad, and $\alpha_{wafer-max}=6$ mrad.

Comparison Examples 1 and 2 pertain to conventional apparatus, and Comparison Example 3 pertains to a situation in which the subject apparatus included an annular aperture, but the beam semi-angle was outside the preferred range.

Table 1, below, lists the various data regarding blurring due to Coulombic repulsion, blurring due to space-charge effects, blurring due to the aggregate Coulomb effect (wherein the aggregate effect is the square root of the sum of squares of respective values for blurring due to Coulombic repulsion and blurring due to space-charge effects), and focal shift (i.e., location of the plane of minimal blur) for each of the foregoing examples and comparison examples.

In each of the examples, the aggregate blurring due to the Coulomb effect was less than 65 nm. Even if the sum of lens aberration and deflection aberration is 60 nm, the square root of the sum of squares yields a value of $(65^2+60^2)^{1/2}=88$ nm. Hence, CPB microlithography apparatus according to the examples exhibit acceptable resolution below 90 nm at any of various beam currents.

In the comparison examples, in contrast, even at a beam current unchanged from the examples, the aggregate blurring due to the Coulomb effect was much more pronounced, as can be seen in Table 1. When geometric aberrations (contributed by deflectors and lenses) of approximately 60 nm are added, the resolution exceeds 90 nm. Consequently, the target resolution is not obtained with any of the comparison examples.

Since Comparison Example 3 included an annular aperture, it yielded better results than did either of Comparison Examples 1 and 2. However, the maximum beam semi-angle in Comparison Example 3 was only 6 mrad. As a result, blurring due to random scattering was not reduced compared to the examples. Also, in Comparative Example 3, suppression of the space-charge effect was slight due to the smaller maximum and minimum beam semi-angles compared to the examples.

TABLE 1

| Ex. | $I_{illum}/4$ μA | L mm | Maximum Beam Semi-angle mrad | Minimum Beam Semi-angle mrad | V KeV | Blurring due to: Scattering From Coulombic Repulsion (nm) | Space-charge Effect (nm) | Aggreg Coulomb Effect (nm) | Location of Min. Blur Plane |
|---|---|---|---|---|---|---|---|---|---|
| 1 | 20 | 500 | 10 | 8 | 100 | 40 | 10 | 50 | 10.7 |
| 2 | 20 | 500 | 9 | 7 | 100 | 42 | 19 | 61 | 11 |
| 3 | 25 | 400 | 12 | 9.6 | 100 | 32 | 11 | 43 | 7 |
| 4 | 25 | 500 | 10 | 8 | 100 | 35 | 12 | 47 | 10 |
| 5 | 25 | 400 | 9 | 7 | 100 | 35 | 15 | 50 | 11 |
| 6 | 22.5 | 450 | 9 | 7 | 100 | 40 | 20 | 60 | 12.2 |
| 7 | 22.5 | 450 | 10 | 8 | 100 | 40 | 15 | 55 | 10.2 |
| 8 | 25 | 500 | 10 | 8 | 120 | 35 | 20 | 55 | 15 |
| 9 | 25 | 500 | 9 | 7 | 100 | 45 | 20 | 65 | 13 |
| C 1 | 25 | 600 | 6 | 0 | 100 | 100 | 50 | 150 | 70 |
| C 2 | 25 | 500 | 6 | 0 | 100 | 79 | 40 | 119 | 63 |
| C 3 | 25 | 500 | 6 | 4 | 100 | 79 | 30 | 109 | 40 |

Therefore, in this embodiment, since the beam semi-angle of the charged particle beam incident to the substrate surface is limited such that the minimum beam semi-angle ($\alpha_{mask-min}$) from the maximum beam semi-angle ($\alpha_{mask-max}$) is within a range of 1.5 mrad to 3 mrad. Also, the beam semi-angles satisfy the relationship:

$$|\alpha_{mask-max} - \alpha_{mask-min}| \leq 0.75 \text{ mrad}$$

when the pattern on the reticle is divided into subfields or other exposure regions that are individually transferred onto the substrate. Also, apparatus according to this embodiment exhibit the following advantages: (1) reduced minimum diameter of blurring due to space-charge effects is reduced by limiting the beam semi-angle of the charged particle beam incident to the substrate surface; (2) placement of the substrate surface where the minimum diameter noted in (1) is exhibited; (3) reduced blurring due to the Coulomb effect; (4) reduced blurring due to the space-charge effect; and (5) feature resolution of 90 nm or less, even when using a beam current greater than 70 μA. The resolution can be further improved by establishing certain relationships between the beam current incident on the reticle surface ($I_{illum}$; in μA), the reticle-to-substrate distance (L; in mm); the beam-acceleration voltage incident to the reticle surface (V; in KeV), and the maximum beam semi-angle of the beam at the substrate surface ($\alpha_{wafer-max}$; in mrad).

Fourth Representative Embodiment

This embodiment is directed to a CPB microlithography apparatus in which the beam semi-angle of the beam is limited as discussed generally above. Between the reticle 7 and scattering aperture 2b (i.e., in association with the first projection lens 3a) are at least six deflectors used primarily for aberration correction. Also, between the scattering aperture 2b and the substrate 5 (i.e., in association with the second projection lens 3b) are at least three deflectors used primarily for aberration correction.

Figure 19:
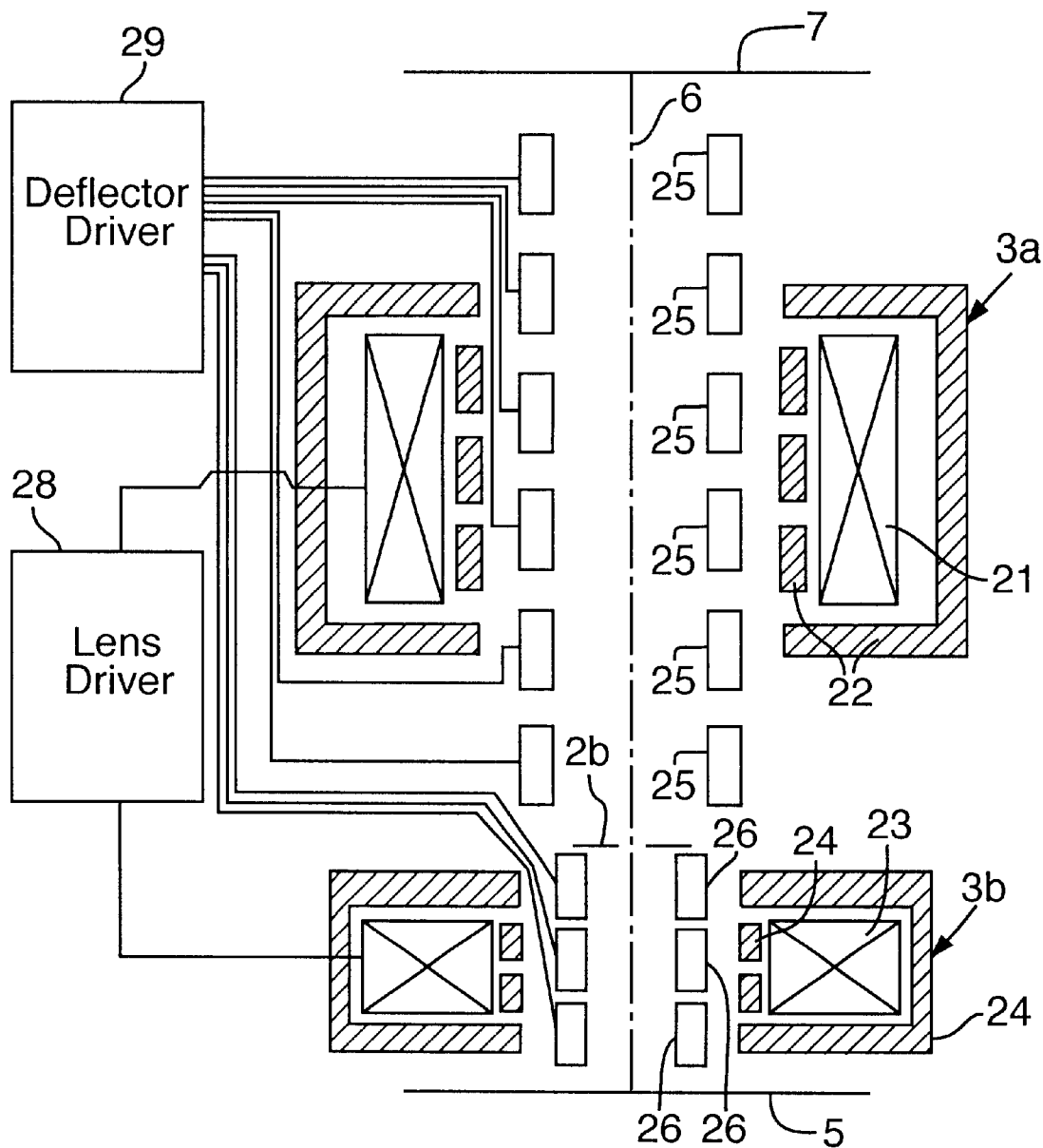
FIG. 19 is a schematic optical diagram illustrating various aspects of a projection-optical system in a CPB microlithography apparatus according to the Fourth Representative Embodiment.

General aspects of this embodiment are shown in FIG. 19, depicting the optical axis 6, reticle 7, the first projection lens 3a, the scattering aperture 2b, the second projection lens 3b, and the substrate (wafer) 5. The first projection lens 3a comprises a coil 21 and magnetic flux conduit 22; and the second projection lens 3b comprises a coil 23 and magnetic flux conduit 24. Six deflectors 25 are arranged along a line parallel to the optical axis 6 in association with the first projection lens 3a, and three deflectors 26 are arranged along a line parallel to the optical axis 6 in association with the second projection lens 3b. The lens coils 21, 23 are connected to and respectively energized by a lens driver 28, and the deflectors 25, 26 are individually connected to and respectively energized by a deflector driver 29.

Although not detailed in FIG. 19, a charged particle beam (e.g., electron beam) is emitted from a CPB source and directed by an illumination-optical system to illuminate a region of the surface of the reticle 7. An image of the illuminated region is transferred to the surface of the substrate 5 by the concerted action of the projection lenses 3a, 3b. The scattering aperture 2b prevents charged particles of the beam that were scattered by the reticle 7 from reaching the substrate 5. The deflectors 25 are disposed on the reticle side of the scattering aperture 2b and the deflectors 26 are disposed on the substrate side of the scattering aperture 2b.

The projection lenses 3a, 3b are driven by the lens driver 28 and controlled so as to properly form an image of the reticle pattern on the substrate 5. The primary role of the deflectors 25, 26 is to guide (by deflection) the charged particle beam, usually passing off-axis through the reticle 7, to a corresponding off-axis location on the surface of the substrate 5 by deflecting the electron beam. In this embodiment, a total of nine deflectors 25, 26 is used to perform the following respective corrections: (1) correction of subfield-image-plane inclination due to deflection, (2) correction of deflection coma, (3) correction of subfield astigmatism due to deflection, (4) correction of deflection chromatic aberration, (5)–(6) correction of subfield secondary distortion due to deflection (two types), (7) passing of the beam through the center of the scattering aperture 2b, (8) deflection of the beam to the target deflection position on the substrate 5, and (9) making of the angle of incidence of the beam on the substrate surface sufficiently perpendicular (telecentric) at the deflection position. Hosokawa, *Optik* 56:21–30, 1980. All the foregoing corrections are preferably simultaneously maintained within respective design specifications.

By employing at least nine deflectors 25, 26 primarily for aberration correction, sufficient design freedom can be achieved in the projection-optical system having a relatively large maximum beam semi-angle (1.5 mrad to 3 mrad at the reticle surface), even when the amount of off-axis deflection is large. Consequently, the projection-optical system keeps aberrations, generated from deflection of the beam, reduced sufficiently while more readily establishing a beam-deflection trajectory that is within specification.

In this embodiment, for an electron beam, the minimum angle $\alpha_{mask-min}$ and the maximum angle $\alpha_{mask-max}$ of the beam semi-angle distribution of the beam at the reticle are preferably within the range of 1.5 mrad to 3 mrad (measured relative to the optical axis), and preferably satisfy the relationship:

$$|\alpha_{mask-min} - \alpha_{mask-max}| \leq 0.75 \text{ mrad}$$

For an electron beam, the lower limit of the beam semi-angle $\alpha_{mask-min}$ is preferably 1.5 mrad because a lower limit less than 1.5 mrad would result in the maximal value of the angular distribution of the beam being too small. Also, if the lower limit were below 1.5 mrad, the diameter of the beam in the vicinity of the aperture would be too small, which would increase the Coulomb-effect blurring due to random scattering. This, in turn, would make it difficult to achieve the target resolution of 90 nm. The upper limit of the beam semi-angle $\alpha_{mask-max}$ is preferably 3 mrad because an upper limit above 3 mrad would result in excessive geometric aberration being exhibited by the projection-lens system. Such excessive geometric aberration would make it difficult to achieve the target resolution of 90 nm even if the Coulomb effect were otherwise adequately suppressed.

The difference $|\alpha_{mask-min} - \alpha_{mask-max}|$ is preferably limited to no greater than 0.75 mrad. If this value were exceeded, then the difference between the maximum beam semi-angle and the minimum beam semi-angle of the beam would be such that the annular illumination field would be too wide. This would diminish the otherwise beneficial effects of annular illumination, which in turn would increase blurring due to the space-charge effect and make it difficult to achieve the target resolution of 90 nm.

In this embodiment, the placement of three deflectors 26 between the scattering aperture 2b and the substrate 5 is necessary to establish a desired deflection trajectory between the scattering aperture 2b and the substrate 5. To achieve even further correction of the trajectory, four or more deflectors 26 can be placed between the scattering aperture 2b and the substrate 5 if the deflectors 26 can be made sufficiently small to fit within this relatively small space. i.e., if the reticle-to-substrate axial distance is about 500 mm or less (which is preferred in order to control the Coulomb effect), then the distance between the scattering aperture 2b and the substrate 5 is about 100 mm or less (taking into account a demagnification ratio of, e.g., ¼). Relatively strong deflection fields are needed to deflect a charged particle beam propagating with an acceleration voltage of about 100 KeV. In order to cause the deflectors 26 to generate an electrical or magnetic field having sufficient strength to adequately deflect the beam under such conditions, each deflector 26 must have a respective coil having a large number of turns. Meanwhile, each deflector 26 preferably has an axial length of no greater than 20 to 30 mm. Therefore, when space constraints is taken into account, three deflectors is frequently the most that can be accommodated within an axial space that is 100 mm long. Therefore, in this embodiment, six deflectors 25 are preferably disposed between the reticle 7 and the scattering aperture 2b, and three deflectors 26 are preferably disposed between the scattering aperture 2b and the substrate 5. Again, more than nine deflectors 25, 26 can be used if they (especially the deflectors 26) can be made sufficiently small.

The deflectors 25, 26 are energized using electrical current or voltage depending upon whether the deflectors are electromagnetic or electrostatic, respectively (either type can be used). In order to energize each deflector 25, 26 properly relative to one another, and achieve satisfactory simultaneous correction of the parameters (1)–(9) listed above, nine simultaneous equations must be solved, as discussed further below. By keeping the solutions to the equations within the respective specified ranges, blurring and all the target aberrations can be minimized while ensuring sufficient telecentricity of the beam and while achieving satisfactory throughput, even if a high-current beam is employed.

This embodiment preferably satisfies the following conditions:

$$AL^a(I_{illum}/4)^b/[V^c(\alpha_{wafer-max})^d] \leq 40 - 2.5(\alpha_{wafer-max} - 10) \quad (1)$$

$$I_{illum} \geq 70 \ \mu A \quad (2)$$

$$V < 200 \text{ KeV and } L \geq 300 \text{ mm} \quad (3)$$

wherein $I_{illum}$ is the beam current incident to the reticle surface, L is the axial distance from the reticle surface to the surface of the substrate 5, V (in KeV) is the beam-acceleration voltage of the beam incident on the surface of the reticle, and $\alpha_{wafer-max}$ (in mrad) is the maximum value of the beam semi-angle of the beam at the surface of the substrate. In the expression (1), above, "A", "a", "b", "c", and "d" are constants, wherein $61 \leq A \leq 81$, $1.2 \leq a \leq 1.4$, $0.6 \leq b \leq 0.85$, $1.3 \leq c \leq 1.6$, and $0.6 \leq d \leq 0.8$, and that $\alpha_{wafer-max} = m\alpha_{mask-max}$, where the demagnification ratio of the projection-optical system is 1/m.

The beam current, $I_{illum}$, incident to the reticle is preferably 70 $\mu$A or greater so as to achieve a desired throughput. However, if less throughput is acceptable, the beam current $I_{illum}$ can be less than 70 $\mu$A, which can result in a correspondingly improved resolution and decreased distortion.

The acceleration voltage V is preferably high to minimize blurring due to Coulombic repulsion and to ensure that the beam is within the maximal sensitivity range of the resist applied to the surface of the substrate. However, whenever the beam current exceeds 200 KeV, the sensitivity of the substrate drops off rapidly, with a corresponding reduction of substrate-processing capacity. Therefore, the upper limit for the acceleration voltage V is 200 KeV for an electron beam.

Blurring is reduced with decreased distance L between the reticle and substrate. However, the reticle-substrate distance L is preferably no less than 300 mm. This is because, with such short distances, correspondingly more current must be delivered to the lenses 9a–9c, 3a–3b to adequately refract the beam, with consequent generation of increased amounts of heat. Whenever L<300 mm, it is also difficult to configure the drivers 28, 29 for the lenses and deflectors, respectively. Therefore, L is preferably 300 mm or greater. The length can be less than 300 mm if the problems noted above can be accommodated.

The left side of the expression:

$$AL^a(I_{illum}/4)^b/[V^c(\alpha_{wafer-max})^d] \leq 40 - 2.5[\alpha_{wafer-max} - 10] \quad (1)$$

represents the magnitude of blurring due to random scattering caused by Coulombic repulsion. The right side of the expression is a function of the maximal beam semi-angle $\alpha_{wafer-max}$. It is necessary to decrease the amount of blurring due to the Coulomb effect by increasing the beam semi-angle so as to yield acceptable performance. Geometric aberrations are increased with an increase in the beam semi-angle, which also change the maximal beam semi-angle. By satisfying the expression (1), the amount of blurring due to random scattering caused by Coulombic repulsion is made dependent on $\alpha_{wafer-max}$, and is decreased to around 35 to 50 nm.

In the foregoing discussion, the deflectors 25, 26 are used primarily for aberration correction. However, it will be understood that these deflectors can also be used to correct errors of displacement of the beam. In such an instance, the conditions for canceling aberrations do not change significantly so long as the required amount of deflection correction is small.

The CPB microlithography apparatus according to this embodiment can also comprise additional deflectors for correcting positional errors of the deflected beam. In such an instance, the conditions for canceling aberrations do not change significantly so long as the required deflection correction is small.

The method of setting respective energization currents for the various deflectors 25, 26 is now explained. The deflectors 25, 26 are preferably configured and placed such that the charged particle beam exiting the reticle 7 passes through the scattering aperture 2a and is incident exactly vertically at the desired location on the surface of the substrate 5. The deflectors also are preferably configured and placed so as to cancel out non-linear components of deflection coma, deflection hybrid field curvature, deflection hybrid astigmatism, deflection chromatic aberration, and deflection hybrid distortion.

The following simultaneous equations provide numerical solutions applicable to the deflectors:

$$\sum_{j=1}^{Nd} M_{co}^{(j)}(\gamma) \cdot I_j = 0 \quad (4)$$

$$\sum_{j=1}^{Nd} H_{fc}^{(j)}(\gamma) \cdot I_j = 0 \quad (5)$$

$$\sum_{j=1}^{Nd} H_{as}^{(j)}(\gamma) \cdot I_j = 0 \quad (6)$$

$$\sum_{j=1}^{Nd} M_{chro}^{(j)}(\gamma) \cdot I_j = 0 \quad (7)$$

-continued $$\sum_{j=1}^{Nd} H_{dis3}^{(j)}(\gamma) \cdot I_j = 0 \quad (8)$$

$$\sum_{j=1}^{Nd} H_{dis4}^{(j)}(\gamma) \cdot I_j = 0 \quad (9)$$

$$\sum_{j=1}^{Nd} w_m^{(j)}(z_{co}) \cdot I_j = 0 \quad (10)$$

$$\sum_{j=1}^{Nd} w_m^{(j)}(z_i) \cdot I_j = \gamma \quad (11)$$

$$\sum_{j=1}^{Nd} (w_m^{(j)})'(z_i) \cdot I_j = 0 \quad (12)$$

In the foregoing equations, "$I_j$" (wherein j=1, 2, ..., $N_d$) denotes the induction current applied to the respective deflector ($N_d$ is the total number of respective deflectors 25, 26). The induction current $I_j$ is expressed by the complex expression: $I_j = I_{jx} + iI_{jy}$, wherein $I_{jx}$ and $I_{jy}$ are the induction currents of the X-deflection and Y-deflection component, respectively, of each deflector 25, 26.

The various aberration terms used in the foregoing equations refer, respectively, to the following aberrations and deflection trajectories each described by a complex expression (the aberrations are normalized to the respective current magnitude):

$M_{co}^{(j)}(\gamma)$ deflection coma $H_{fc}^{(j)}(\gamma)$ deflection hybrid field curvature $H_{as}^{(j)}(\gamma)$ deflection hybrid astigmatism $M_{chro}^{(j)}(\gamma)$ deflection chromatic aberration $H_{dis3}^{(j)}(\gamma)$ deflection hybrid distortion $H_{dis4}^{(j)}(\gamma)$ deflection hybrid distortion $W_m^{(j)}(Zco)$ deflection path at the scattering aperture $Z_{co}$ $W_m^{(j)}(Z_i)$ deflection path at the substrate $Z_i$ $(W_m^{(j)})'(Z_i)$ angle of incidence of deflection trajectory at $Z_i$ The term "$\gamma$" is the complex coordinate expressed by $\gamma = (x+iy)$, where (x,y) denotes the coordinates of the target deflection position on the surface of the substrate.

The foregoing equations can be solved for $I_j$ using a least-squares method so as to minimize (if not completely cancel) the weight function defined by Equation (13), below. If the weight function of Equation (13) is not optimal (e.g., whenever a large amount of a certain aberration is remaining, etc.), Equation (13) may be solved by the least-squares method while adding separate weighting functions to the various terms in the equation. In addition, the various current values do not necessarily have to be determined by the least-squares method, but alternatively may be found using any of various other commonly known optimization techniques.

$$W_3 = \left|\sum_{j=1}^{Nd} M_{co}^{(j)}(\gamma) \cdot I_j\right|^2 + \left|\sum_{j=1}^{Nd} H_{fc}^{(j)}(\gamma) \cdot I_j\right|^2 + \left|\sum_{j=1}^{Nd} H_{as}^{(j)}(\gamma) \cdot I_j\right|^2 + \left|\sum_{j=1}^{Nd} M_{chro}^{(j)}(\gamma) \cdot I_j\right|^2 + \quad (13)$$

$$\left|\sum_{j=1}^{Nd} H_{dis3}^{(j)}(\gamma) \cdot I_j\right|^2 + \left|\sum_{j=1}^{Nd} H_{dis4}^{(j)}(\gamma) \cdot I_j\right|^2 +$$

$$\left|\sum_{j=1}^{Nd} w_m^{(j)}(z_{co}) \cdot I_j\right|^2 + \left|\sum_{j=1}^{Nd} w_m^{(j)}(z_i) \cdot I_j - \gamma\right|^2 +$$

$$\left|\sum_{j=1}^{Nd} (w_m^{(j)})'(z_i) \cdot I_j\right|^2$$

Whenever the deflectors 25, 26 are electrostatic deflectors, the respective voltages applied to the deflectors can be determined by methods similar to the above.

Representative methods for setting the deflection trajectory of the beam (i.e., setting beam alignment) are as follows. In a first step, an electrical current according to the respective design specification is delivered to each respective deflector. The current absorbed by the scattering aperture 2b is also measured and reduced by making fine adjustments to the respective current delivered to each deflector. Thus, the position at which the beam passes through the scattering aperture is adjusted. Using a "wobbling" method, lateral beam displacement is detected while changing the respective lens currents. ["Wobbling" involves varying lens focus by varying the lens excitation current and measuring the resulting beam drift (lateral beam shift). If the beam drifts, then the incidence angle of the beam at the substrate surface is not telecentric (i.e., not zero). In such a case, equation (12) is not satisfied, so the beam is readjusted slightly by changing currents (or voltages) applied to deflection coils. Wobbling is a common method employed among persons skilled with electron-beam optics.] The beam is aligned so that positional displacements are eliminated (this method only can be used for on-axis beam alignment).

In the foregoing steps the deflection trajectory is set. In an additional step, the deflection sensitivity of each deflector either is directly detected at the image plane, or is measured from an exposure resist pattern at a coordinate measurement position. The measured deflector sensitivity is routed back into the system and the current values are optimized and reset as required from such feedback. The deflection sensitivity of each deflector can be measured at the image plane using "knife-edge" detection using, e.g., a Faraday cup, a backscattered-electron detector detecting electrons reflected from a heavy-metal or step-difference mark, or a photomultiplier tube.

After the deflectors 25, 26 have been aligned, beam alignment is completed by comparing the resolutions of the image on the axis and at locations laterally displaced from the axis, and confirming the absence of differences between the two in either resolution or image distortion.

The greater the number of deflectors 25, 26, the greater the design freedom. However, as discussed above, there are certain dimensional restrictions to the maximal number of deflectors. There are instances in which the number of deflectors disposed on the substrate side of the scattering aperture 2b is limited to no more than three. Consequently, if a greater number of deflectors is desired, it is more practical to situate the additional deflectors between the reticle and the scattering aperture 2b.

When transferring off-axis images, if any additional correction is desired of aberrations such as deflection field curvature, deflection astigmatism, and deflection subfield linear distortions, methods employing compensation coils and/or stigmators can be employed, as described in, e.g., Japanese Patent Application No. 10-59659 filed on Mar. 11, 1998. Methods can also be applied such as described in the Fifth Representative Embodiment below.

Fifth Representative Embodiment

Figure 20:
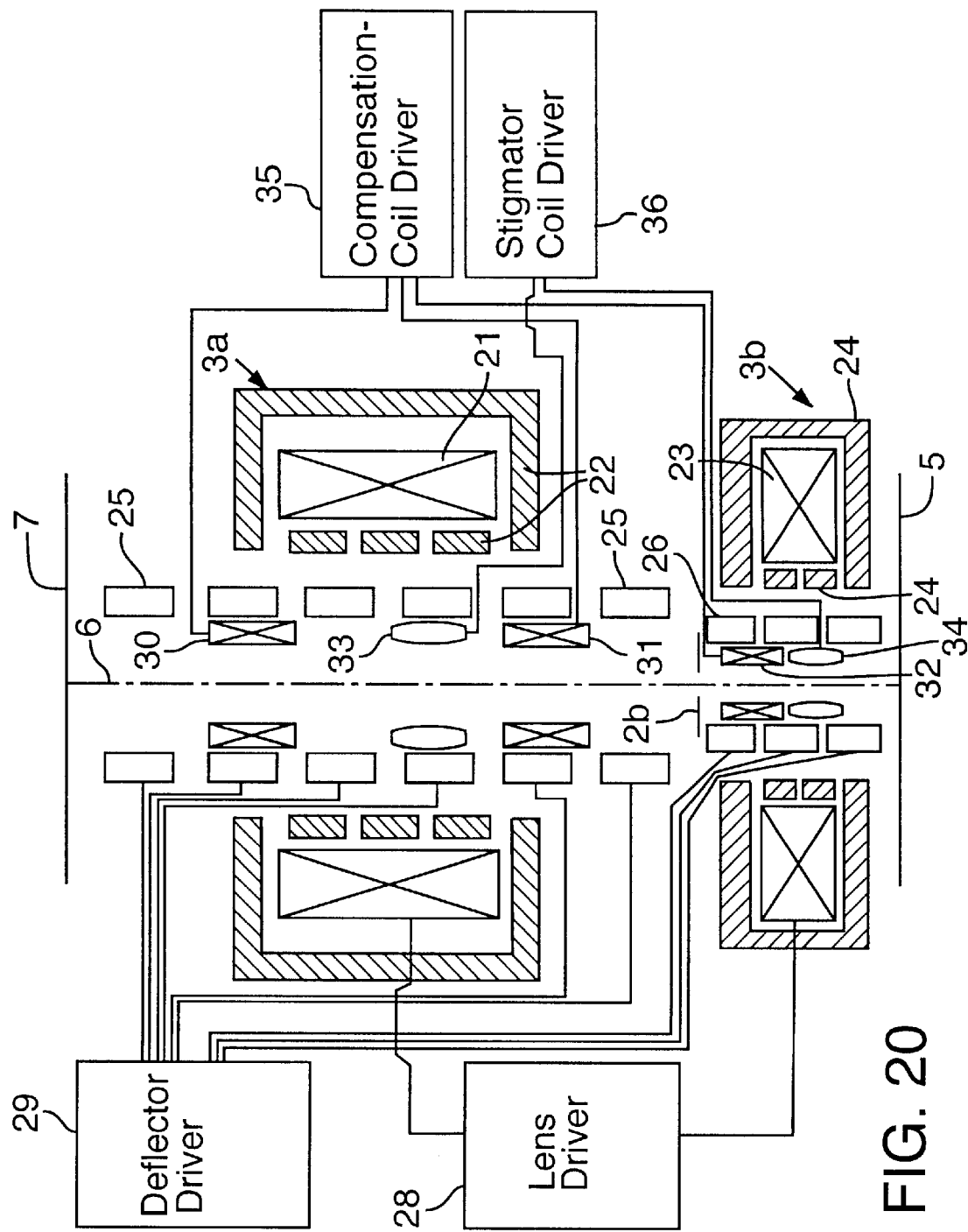
FIG. 20 is a schematic optical diagram illustrating various aspects of a projection-optical system in a CPB microlithography apparatus according to the Fifth Representative Embodiment.

This embodiment is shown in FIG. 20, and includes the capability of correcting deflection field curvature, deflection astigmatism, and deflection subfield linear distortions. In FIG. 20, components that are similar to those shown in FIG. 19 have the same reference numerals and are not described further. The FIG. 20 embodiment includes the following components not included in the FIG. 19 embodiment: compensation coils 30, 31, 32; stigmators 33, 34; a compensation-coil driver 35 connected to each of the compensation coils 30–32, and a stigmator driver 36 connected to each of the stigmators 33–34.

In the FIG. 20 embodiment, there are three compensation coils 30, 31, 32 and two stigmators 33, 34. The compensation-coil driver 35 drives the compensation coils 30–32, and the stigmator driver 36 drives the stigmators 33, 34 according to the deflection position of the charged particle beam. Thus, the compensation coils 30–32 and the stigmators 33–34 cancel out deflection field curvature, deflection astigmatism, and the various linear distortions of the exposure regions (e.g., changes in rotation and magnification of a region due to deflection, and changes in orthogonality and anisotropic magnification of a region due to deflection).

Depending upon the beam current, the position of the image plane can be displaced along the optical axis 6 by, e.g., a change in magnification or rotation of the exposure region, a change in astigmatism, or a change in orthogonality or anisotropic magnification of the region due to space-charge effects. The relative magnitudes of these changes can be compensated for using the compensation coils 30–32 and the stigmators 33–34 in the same manner as described above with respect to the deflection aberrations (deflection field curvature, deflection astigmatism, deflection-induced changes in rotation of the exposure region, and deflection-induced changes in magnification of the exposure region), as well as shifts in exposure-region orthogonality and anisotropic magnification due to deflection. Therefore, the compensation coils 30–32 and the stigmators 33–34 can be driven by the compensation-coil driver 35 and the stigmator driver 36, respectively, according to the shifts resulting from space-charge effects, so as to correct these aberrations. The compensation coils 30–32, stigmators 33–34, and their respective drivers 35, 36 can also be utilized for compensating for space-charge effects.

EXAMPLE 10

In this example, an electron-beam microlithography apparatus as shown in FIG. 20 was configured to sequentially transfer individual subfields that measured, when projected onto the substrate, 0.25 mm by 0.25 mm. The demagnification ratio was ¼. The various deflectors were configured such that blurring due to deflection aberrations was 74 nm and subfield-image distortion was 6 nm at maximal deflection (2.5 mm deflection from the optical axis) as listed in Table 2. In Table 2, C1, C2, C3, C4, C5, and C6 (numbered in order from the reticle side) are respective toroidal deflectors 25 situated between the reticle 7 and the scattering aperture 2b. P1, P2, and P3 (numbered in order from the reticle side) are respective toroidal deflectors 26 situated between the scattering aperture 2b and the substrate 5. The listed deflector positions correspond to the center of each respective deflector along the optical axis 6. The distance from the reticle 7 to the substrate 5 was 500 mm (with "0 mm" being at the reticle 7). The scattering aperture was situated at 400 mm from the reticle 7. Annular illumination of the reticle 7 was performed such that the beam semi-angle of the beam at the substrate 5 ranged from 7 mrad to 9 mrad, and from 1.75 mrad to 2.25 mrad at the reticle surface.

In this example, blurring due to the Coulomb effect and to space-charge effects was 60 nm with a 100 KeV beam-acceleration voltage. The beam current reaching the substrate 5 was 20 $\mu$A. Blurring due to deflection aberrations was 74 nm. (A beam current of 20 $\mu$A at the substrate is equivalent to an illumination current $I_r$ of 80 $\mu$A when the average percent of openings to non-openings in the reticle is 25%.)

In view of the above, the total blurring, estimated from a blurring of 74 nm due to deflection aberrations and a blurring of 60 nm due to the Coulomb effect and the space-charge effect, is $(74^2+60^2)^{1/2}=95$ nm, which is adequate performance for a system intended to provide a resolution of 100 nm.

In Table 2, the reticle position is 0 mm, and the substrate position is 500 mm.

TABLE 2

| Deflector | Position (mm) | Induction Current (X,Y) (A-Turn) | Inside Diameter (mm) | Axial Length (mm) |
| --- | --- | --- | --- | --- |
| C1 | 56.0 | (−184.3537, −7.5721) | 104.0 | 52.0 |
| C2 | 120.0 | (−66.0221, −2.7118) | 104.0 | 52.0 |
| C3 | 277.8 | (159.9348, 6.5691) | 104.0 | 52.0 |
| C4 | 350.0 | (−43.4736, −1.7856) | 104.0 | 52.0 |
| C5 | 314.0 | (−76.4984, −3.1421) | 80.0 | 40.0 |
| C6 | 368.4 | (−21.2811, −0.8741) | 60.0 | 20.0 |
| P1 | 424.6 | (−79.3851, 154.5597) | 48.0 | 16.0 |
| P2 | 445.0 | (−433.3970, 843.7723) | 66.0 | 22.0 |
| P3 | 470.0 | (−304.9467, 539.7194) | 58.2 | 19.4 |

Whereas the invention has been described in connection with multiple representative embodiments and examples, it will be understood that the invention is not limited to those embodiments and examples. On the contrary, the invention is intended to encompass all modifications, alternatives, and equivalents as may be included within the spirit and scope of the invention as defined by the appended claims.

What is claimed is:

1. A charged-particle-beam microlithography apparatus, comprising on an optical axis:

(a) an illumination-optical system configured and situated so as to direct a charged particle beam from a source to a reticle and illuminate a region of the reticle with the charged particle beam;

(b) a projection-optical system configured and situated relative to the reticle so as to direct the charged particle beam, passing through the illuminated region of the reticle, to a substrate so as to form an image of the illuminated region on a corresponding exposure region on the substrate, the image having an optimal image plane;

(c) a beam-semi-angle-limiting device situated upstream of the substrate, the beam-semi-angle-limiting device being configured to configure the charged particle beam such that, as the beam is incident on the substrate, the beam has a beam semi-angle that is greater than a lower limit but not zero, and less than an upper limit greater than the lower limit, the beam-semi-angle-limiting device comprising an aperture plate that defines an annular aperture, the aperture plate being situated within a region in which the charged particle beam is collimated; and (d) a mechanism for imparting a displacement of the optimal image plane and the substrate relative to each other along the optical axis as required to achieve a reduction of blurring of the charged particle beam incident on the substrate.

2. The apparatus of claim 1, wherein the aperture plate is situated within the illumination-optical system.

3. The apparatus of claim 1, wherein the aperture plate is situated within the projection-optical system.

4. The apparatus of claim 3, wherein the aperture plate is situated within a region in which the charged particle beam is collimated.

5. The apparatus of claim 1, further comprising a charged-particle-beam source, wherein the beam-semi-angle-limiting device comprises an annular cathode on the charged-particle-beam source.

6. The apparatus of claim 1, further comprising a corrective lens that refracts the charged particle beam before the beam is incident on the substrate, the refraction being sufficient to maximally reduce blurring of the charged particle beam incident on the substrate.

7. The apparatus of claim 1, wherein the beam-semi-angle-limiting device provides the charged particle beam with a range of beam semi-angles in which a minimum beam semi-angle ($\alpha_{mask-min}$) at the reticle and a maximum beam semi-angle ($\alpha_{mask-max}$) at the reticle are 1.5 to 3.0 mrad.

8. The apparatus of claim 7, wherein:

the charged particle beam is an electron beam; and the projection-optical system satisfies the conditions:

$$AL^a(I_{illum}/4)^b/[V^c(\alpha_{wafer-max})^d] \leq 40-2.5(\alpha_{wafer-max}-10)$$

$$I_{illum} \geq 70 \ \mu A$$

$$V \leq 200 \ KeV$$

$$L \geq 300 \ mm$$

wherein $I_{illum}$ is a beam current, in $\mu A$, of the electron beam as incident on the reticle; L is an axial distance, in mm, between the reticle and the substrate; V is a beam-acceleration voltage, in KeV, of the electron beam incident on the reticle; $\alpha_{wafer-max}$ is a maximum value of the beam semi-angle of the electron beam as incident on the substrate; and A, a, b, c, and d are constants wherein $61 \leq A \leq 81$, $1.2 \leq a \leq 1.4$, $0.6 \leq b \leq 0.85$, $1.3 \leq c \leq 1.6$, and $0.6 \leq d \leq 0.8$.

9. The apparatus of claim 7, wherein:

$$|\alpha_{mask-min} - \alpha_{mask-max}| \leq 0.75 \ mrad.$$

10. The apparatus of claim 9, wherein:

the charged particle beam is an electron beam; and the projection-optical system satisfies the conditions:

$$AL^a(I_{illum}/4)^b/[V^c(\alpha_{wafer-max})^d] \leq 40-2.5(\alpha_{wafer-max}-10)$$

$$I_{illum} \geq 70 \ \mu A$$

$$V \leq 200 \ KeV$$

$$L \geq 300 \ mm$$

wherein $I_{illum}$ is a beam current, in $\mu A$, of the electron beam as incident on the reticle; L is an axial distance, in mm, between the reticle and the substrate; V is a beam-acceleration voltage, in KeV, of the electron beam incident on the reticle; $\alpha_{wafer-max}$ is a maximum value of the beam semi-angle of the electron beam as incident on the substrate; and A, a, b, c, and d are constants wherein $61 \leq A \leq 81$, $1.2 \leq a \leq 1.4$, $0.6 \leq b \leq 0.85$, $1.3 \leq c \leq 1.6$, and $0.6 \leq d \leq 0.8$.

11. The apparatus of claim 1, wherein:

the charged particle beam is an electron beam; and the projection-optical system satisfies the conditions:

$$AL^a(I_{illum}/4)^b/[V^c(\alpha_{wafer-max})^d] \leq 40-2.5(\alpha_{wafer-max}-10)$$

$$I_{illum} \geq 70 \ \mu A$$

$$V \leq 200 \ KeV$$

$$L \geq 300 \ mm$$

wherein $I_{illum}$ is a beam current, in $\mu A$, of the electron beam as incident on the reticle; L is an axial distance, in mm, between the reticle and the substrate; V is a beam-acceleration voltage, in KeV, of the electron beam incident on the reticle; $\alpha_{wafer-max}$ is a maximum value of the beam semi-angle of the electron beam as incident on the substrate; and A, a, b, c, and d are constants wherein $61 \leq A \leq 81$, $1.2 \leq a \leq 1.4$, $0.6 \leq b \leq 0.85$, $1.3 \leq c \leq 1.6$, and $0.6 \leq d \leq 0.8$.

12. The apparatus of claim 1, wherein the mechanism comprises a mechanism for moving the substrate along the optical axis.

13. The apparatus of claim 1, wherein the mechanism comprises a corrective lens.

14. In a method for performing microlithographic projection-transfer of a pattern, defined by a reticle, onto a sensitive surface of a substrate by directing a charged particle beam along an optical axis from a source to a reticle to illuminate a region of the reticle with the charged particle beam, and directing the charged particle beam that passes through the illuminated region of the reticle to the sensitive surface of the substrate so as to imprint an image of the illuminated region on a corresponding exposure region on the sensitive surface, an improvement for reducing beam blurring at the sensitive surface caused by any one or more of spherical aberrations, Coulomb effects, and space-charge effects, the improvement comprising:

(a) at a location at which the charged particle beam is collimated, blocking paraxial portions of the beam smaller than a first diameter;

(b) at the location, blocking off-axis portions of the beam greater than a second diameter that is larger than the first diameter, so as to allow passage to the sensitive surface of portions of the charged particle beam having a beam semi-angle that is greater than a lower limit greater than zero, and less than an upper limit greater than the lower limit; and (c) displacing the substrate and an optimal image plane relative to each other along the optical axis as required to reduce blur of the charged particle beam as incident on the substrate.

15. The method of claim 14, wherein step (b) provides the beam with a range of beam semi-angles in which a minimum beam semi-angle ($\alpha_{mask-min}$) at the reticle and a maximum beam semi-angle ($\alpha_{mask-max}$) at the reticle are 1.5 to 3.0 mrad.

16. The method of claim 15, wherein $|\alpha_{mask-min}-\alpha_{mask-max}| \leq 0.75$ mrad.

17. The method of claim 14, wherein step (c) comprises passing the charged particle beam through a corrective lens that refracts the charged particle beam before the beam is incident on the substrate, the refraction being sufficient to maximally reduce blurring of the charged particle beam incident on the substrate.

18. The method of claim 14, further comprising the steps of:

detecting an axial position of the optimal image plane; and moving the substrate along the axis as required to place the sensitive surface at the optimal image plane.

19. In a method for performing microlithographic projection-transfer of a pattern, defined by a reticle, onto a sensitive surface of a substrate by directing a charged particle beam from a source to a reticle to illujminate a region of the reticle with the charged particle beam, and directing the charged particle beam that passes through the illuminated region of the reticle to the sensitive surface of the substrate so as to imprint an image of the illuminated region on a corresponding exposure region on the sensitive surface, an improvement for reducing beam blurring at the sensitive substrate caused by any one or more of spherical aberrations, Coulomb effects, and space-charge effects, the improvement comprising:

(a) at a location where the charged particle beam is collimated, blocking paraxial portions of the beam smaller than a first diameter;

(b) at the location, blocking off-axis portions of the beam greater than a second diameter that is larger than the first diameter, so as to allow passage to the sensitive surface of portions of the charged particle beam having a beam semi-angle within a limited range not including a zero beam semi-angle;

(c) detecting an axial location where the beam, refracted for forming an image of the illuminated region on the sensitive surface, has a minimum diameter; and (d) axially placing the substrate to place the minimum-diameter portion of the beam on the sensitive surface.

20. The method of claim 19, wherein step (b) provides the beam with a range of beam semi-angles in which a minimum beam semi-angle ($\alpha_{mask-min}$) at the reticle and a maximum beam semi-angle ($\alpha_{mask-max}$) at the reticle are 1.5 to 3.0 mrad.

21. The method of claim 20, wherein $|\alpha_{mask-min}-\alpha_{mask-max}| \leq 0.75$ mrad.

* * * * *

UNITED STATES PATENT AND TRADEMARK OFFICE
CERTIFICATE OF CORRECTION

PATENT NO. : 6,441,384 B1
DATED : August 27, 2002
INVENTOR(S) : Shinichi Kojima

It is certified that error appears in the above-identified patent and that said Letters Patent is hereby corrected as shown below:

Column 5,
Line 10, "$I_{illum} 24\ 70\ \mu A$" should be -- $I_{illum} \geq 70\ \mu A$ --;
Line 47, "$AL^{\alpha(I}{}_{illum}/4)^b/[V^c(\alpha_{wafer-max})^d] < 40 - 2.5(\alpha_{wafer-max} - 10)$" should be
-- $AL^a(I_{illum}/4^b/[V^c(\alpha_{wafer-max})^d] \leq 40 - 2.5\ (\alpha_{wafer-max} - 10)$ --;

Column 7,
Line 11, "$AL^{\alpha(}I_{illum}/4)^b/[V^c(\alpha_{wafer-max})^d] \leq 40 - 2.5(\alpha_{wafer-max} - 10)$" should be
-- $Al^a(I_{illum}/4^b/[V^c(\alpha_{wafer-max})^d] \leq 40 - 2.5\ (\alpha_{wafer-max} - 10)$ --;
Line 38, "amask-max" should be -- $\alpha_{mask-max}$ --;

Column 10,
Line 13, "can have a configurations," should be -- can have any of various configurations, --;

Column 11,
Line 67, "at" should be -- as --;

Column 15,
Lines 31 and 36, "αwafer-min=7" should be -- $\alpha_{wafer-min} = 7$ --;

Column 25,
Line 39, "$AL^{\alpha(}I_{illum}/4)^b/[V^c(\alpha_{wafer-max})^d]40-2.5(\alpha_{wafer-max} - 10)$" should be
-- $AL^{\alpha(}I_{illum}/4)^b/[V^c(\alpha_{wafer-max})^d] \leqq 40 - 2.5(\alpha_{wafer-max} - 10)$ --;

Column 27,
Line 18, "illujminate" should be -- illuminate --.

Signed and Sealed this

Twenty-fourth Day of June, 2003

JAMES E. ROGAN
*Director of the United States Patent and Trademark Office*